(12) United States Patent
Kim et al.

(10) Patent No.: US 8,031,517 B2
(45) Date of Patent: Oct. 4, 2011

(54) MEMORY DEVICE, MEMORY SYSTEM HAVING THE SAME, AND PROGRAMMING METHOD OF A MEMORY CELL

(75) Inventors: Ho Jung Kim, Suwon-si (KR); Chul Woo Park, Yongin-si (KR); Sang Beom Kang, Hwaseong-si (KR); Hyun Ho Choi, Suwon-si (KR); Seung Eon Ahn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 12/461,036

(22) Filed: Jul. 30, 2009

(65) Prior Publication Data

US 2010/0027326 A1    Feb. 4, 2010

(30) Foreign Application Priority Data

Jul. 30, 2008   (KR) .................. 10-2008-0074656
Dec. 24, 2008   (KR) .................. 10-2008-0133071

(51) Int. Cl.
 *G11C 11/00*  (2006.01)
(52) U.S. Cl. .................. 365/163; 365/185.24
(58) Field of Classification Search .......... 365/163, 365/185.24
See application file for complete search history.

(56) References Cited

U.S. PATENT DOCUMENTS

| | | | | |
|---|---|---|---|---|
| 6,157,334 A * | 12/2000 | Kimura | ................ | 341/153 |
| 7,443,721 B2 | 10/2008 | Kurotsuchi et al. | | |
| 7,457,157 B2 * | 11/2008 | Kim | ................ | 365/185.03 |
| 7,480,178 B2 * | 1/2009 | Park et al. | ................ | 365/185.17 |
| 7,486,536 B2 | 2/2009 | Kim et al. | | |
| 7,499,372 B2 * | 3/2009 | Asauchi et al. | ................ | 365/239 |
| 7,515,459 B2 | 4/2009 | Kang et al. | | |
| 2006/0294034 A1 * | 12/2006 | Fuji | ................ | 706/33 |
| 2008/0062751 A1 | 3/2008 | Park et al. | | |
| 2008/0080250 A1 | 4/2008 | Lee | | |
| 2008/0123389 A1 | 5/2008 | Cho et al. | | |
| 2008/0205161 A1 | 8/2008 | Kang | | |
| 2008/0266948 A1 * | 10/2008 | Jang et al. | ................ | 365/185.03 |

FOREIGN PATENT DOCUMENTS

| | | |
|---|---|---|
| KR | 10-2006-0090744 A | 8/2006 |
| KR | 10-2006-0105358 A | 10/2006 |
| KR | 10-2007-0005823 A | 1/2007 |
| KR | 10-0763231 B1 | 9/2007 |
| KR | 10-0801082 B1 | 1/2008 |
| KR | 10-2008-0029758 A | 4/2008 |
| KR | 10-0823174 B1 | 4/2008 |
| WO | WO 2006/128896 A1 | 12/2006 |

* cited by examiner

*Primary Examiner* — Michael Tran
(74) *Attorney, Agent, or Firm* — Lee & Morse, P.C.

(57) ABSTRACT

A method of writing multi-bit data to a semiconductor memory device with memory cells storing data defined by a threshold value, the method comprising, for each memory cell, writing a least significant bit, verifying completion of writing the least significant bit, verifying including comparing a written value to one of a low least significant bit verification value and a high least significant bit verification value, and writing a next significant bit upon completion of writing the least significant bit.

25 Claims, 24 Drawing Sheets

MEMORY DEVICE, MEMORY SYSTEM HAVING THE SAME, AND PROGRAMMING METHOD OF A MEMORY CELL

BACKGROUND

1. Field

Embodiments relate to a semiconductor device, and more particularly, to a semiconductor device which enables fast execution of a program speed, a semiconductor system having the same, and a method of programming a memory cell.

2. Description of the Related Art

Memories are divided into volatile memories and non-volatile memories. Dynamic random access memories (DRAMs) and static random access memories (SRAMs) are volatile memories and flash memories, resistive memories, and phase change memories are non-volatile memories. The resistive memory uses a resistance value of a memory device to store one or more bits of data.

SUMMARY

It is therefore a feature of an embodiment to provide a semiconductor device which enables fast execution of a program, a semiconductor system having the same, and a method of programming a resistive memory cell.

According to an aspect of the inventive concept, there is provided a method of programming a semiconductor device including writing a first bit of data stored in a memory cell based on a first reference resistance value, and writing a second bit of the data based on a second reference resistance value. The second reference resistance value may be greater than or less than the first reference resistance value.

The first bit may be a higher bit of the data and the second bit may be a lower bit of the data.

According to an aspect of the inventive concept, there is provided a method of writing multi-bit data to a semiconductor memory device with memory cells storing data defined by a threshold value, the method comprising, for each memory cell writing a least significant bit, verifying completion of writing the least significant bit, verifying including comparing a written value to one of a low least significant bit verification value and a high least significant bit verification value, and writing a next significant bit upon completion of writing the least significant bit.

Writing the least significant bit may include applying a write signal having a value higher than the threshold value.

Writing the least significant bit and the next significant bit for a current memory cell may be completed before writing to a next memory cell.

A value dispersion of a next significant bit having a first logic level and a value dispersion of a next significant bit having a second logic level may each partially overlap a value dispersion of the least significant bit on opposite sides of the value dispersion of the least significant bit.

A value dispersion of a next significant bit having a first logic level may completely overlap a value dispersion of the least significant bit.

Writing the least significant bit may include writing a first value less than a reference value when the least significant bit has a first logic level and writing a second value greater than the reference value when the least significant bit has a second logic level, when the least significant bit has the first logic level, writing the next significant bit includes writing a third value less than the reference value, and when the least significant bit has the second logic level, writing the next significant bit includes writing a fourth value greater than the reference value.

The first value and the second value may be spaced symmetrically with respect to the reference value or the first value may be closer to the reference value than the second value.

The third value may be greater than or equal to the first value and the fourth value may be less than or equal to the second value. The third value may be less than or equal to the first value and the fourth value may be greater than or equal to the second value. The third value may be less than or equal to the first value and the fourth value may be less than or equal to the second value. The third value may be greater than or equal to the first value and the fourth value may be greater than or equal to the second value.

Writing the least significant bit may include writing a first value less than a reference value when the least significant bit has a first logic level and writing a second value greater, than the reference value when the least significant bit has a second logic level, when the least significant bit has the first logic level, writing a most significant bit includes writing a third value less than the reference value, and when the least significant bit has the second logic level, writing the most significant bit includes writing a fourth value greater than the reference value.

Each memory cell may be a variable resistive memory cell. The variable resistive memory cell may be a phase change memory cell.

When verifying indicates writing is not complete, the method may include altering a current write signal used in writing to generate an altered write signal different from the current write signal and writing the least significant bit using the altered write signal. Altering the current write signal may include varying at least one of a pulse width and a pulse height of the current write signal. Varying may include increasing at least one of a pulse width and a pulse height of the current write signal.

The method may further include verifying completion of writing the next significant bit, and, when verifying indicates writing of the next significant bit is not complete, altering a current write signal used in writing the next significant bit to generate an altered write signal different from the current write signal and writing the next significant bit using the altered write signal.

The next significant bit may be written to a cell that is not adjacent to a cell in which the least significant bit is written.

According to an aspect of the inventive concept, there is provided a method of writing multi-bit data to a variable resistive memory device, the method including writing a least significant including applying a write signal to a variable resistive memory cell to alter a resistance of the variable resistive memory cell, and writing a next significant bit upon completion of writing the least significant bit.

Before writing the next significant bit, the method may include verifying completion of writing the least significant bit. Verifying may include comparing a written resistance value to of a low least significant bit verification value and a high least significant bit verification value.

The method may include verifying completion of writing the next significant bit including comparing a written resistance value to a single next significant bit verification value.

The variable resistive memory cell is a phase change memory cell.

According to an aspect of the inventive concept, there is provided a memory device, including a memory cell storing data defined by a threshold value, a write circuit connected to the memory cell, the write circuit being configured to write a least significant bit and a next significant bit to the memory cell, and a read circuit connected to the memory cell, the read circuit being configured to verify completion of writing the least significant bit, the read circuit including a comparator that compares a written value to one of a low least significant bit verification value and a high least significant bit verification value, wherein the write circuit is configured to write a next significant bit when the read circuit verifies completion of writing the least significant bit.

The memory device may include a plurality of the memory cells.

The write circuit may be configured to write the least significant bit by applying a write signal having a value higher than the threshold value.

The write circuit may be configured to write the least significant bit using a first value less than a reference value when the least significant bit has a first logic level and using a second value greater than the reference value when the least significant bit has a second logic level, when the least significant bit has the first logic level, write the next significant bit using a third value less than the reference value, and, when the least significant bit has the second logic level, write the next significant bit using a fourth value greater than the reference value.

The first value and the second value may be spaced symmetrically with respect to the reference value. The first value may be closer to the reference value than the second value.

The third value is greater than or equal to the first value and the fourth value may be less than or equal to the second value. The third value may be less than or equal to the first value and the fourth value may be greater than or equal to the second value. The third value may be less than or equal to the first value and the fourth value may be less than or equal to the second value. The third value may be greater than or equal to the first value and the fourth value may be greater than or equal to the second value.

When the read circuit indicates writing is not complete, the write circuit may be configured to alter a current write signal used in writing to generate an altered write signal different from the current write signal and write the least significant bit using the altered write signal.

The write circuit may be configured to alter the current write signal by varying at least one of a pulse width and a pulse height of the current write signal. The write circuit may be configured to alter the current write signal by increasing at least one of a pulse width and a pulse height of the current write signal.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
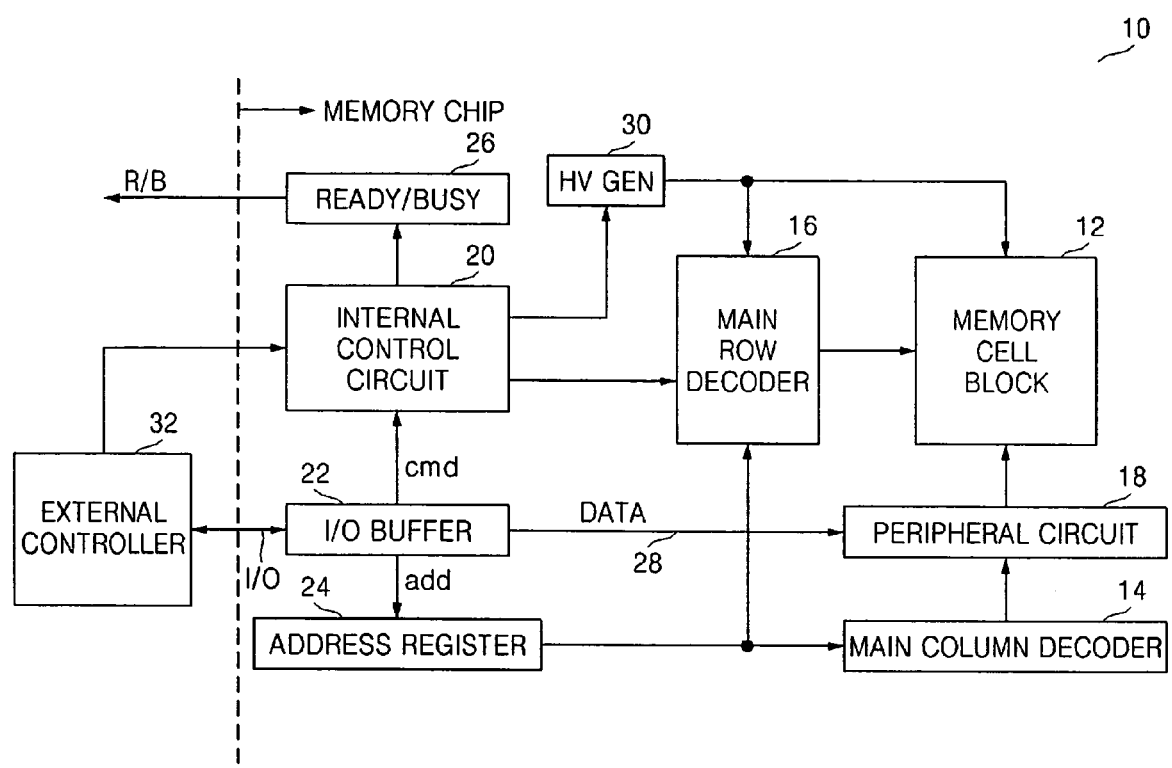
FIG. 1 illustrates block diagram of a semiconductor device according to an exemplary embodiment of the present inventive concept.

Korean Patent Application No. 10-2008-0074656, filed on Jul. 30, 2008, and Korean Patent Application No. 10-2008-0133071, filed on Dec. 24, 2008, in the Korean Intellectual Property Office, is incorporated by reference herein in its entirety.

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

The disclosure of U.S. application Ser. No. 11/855,525, now U.S. Publication No. 2008/0123389, is incorporated herein in its entirety by reference.

Figure 2:
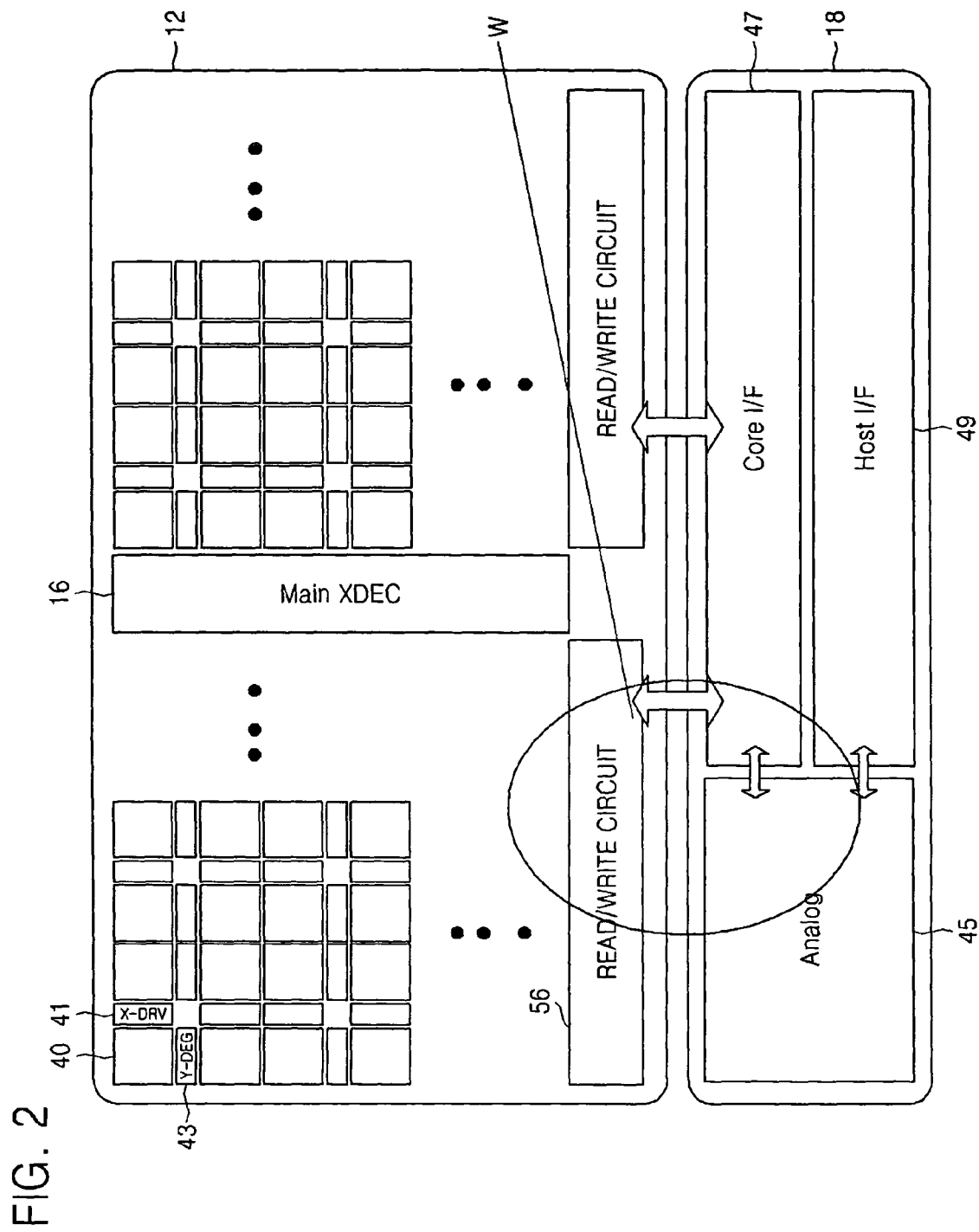
FIG. 2 illustrates a circuit diagram of a memory cell block of FIG. 1.
Figure 3:
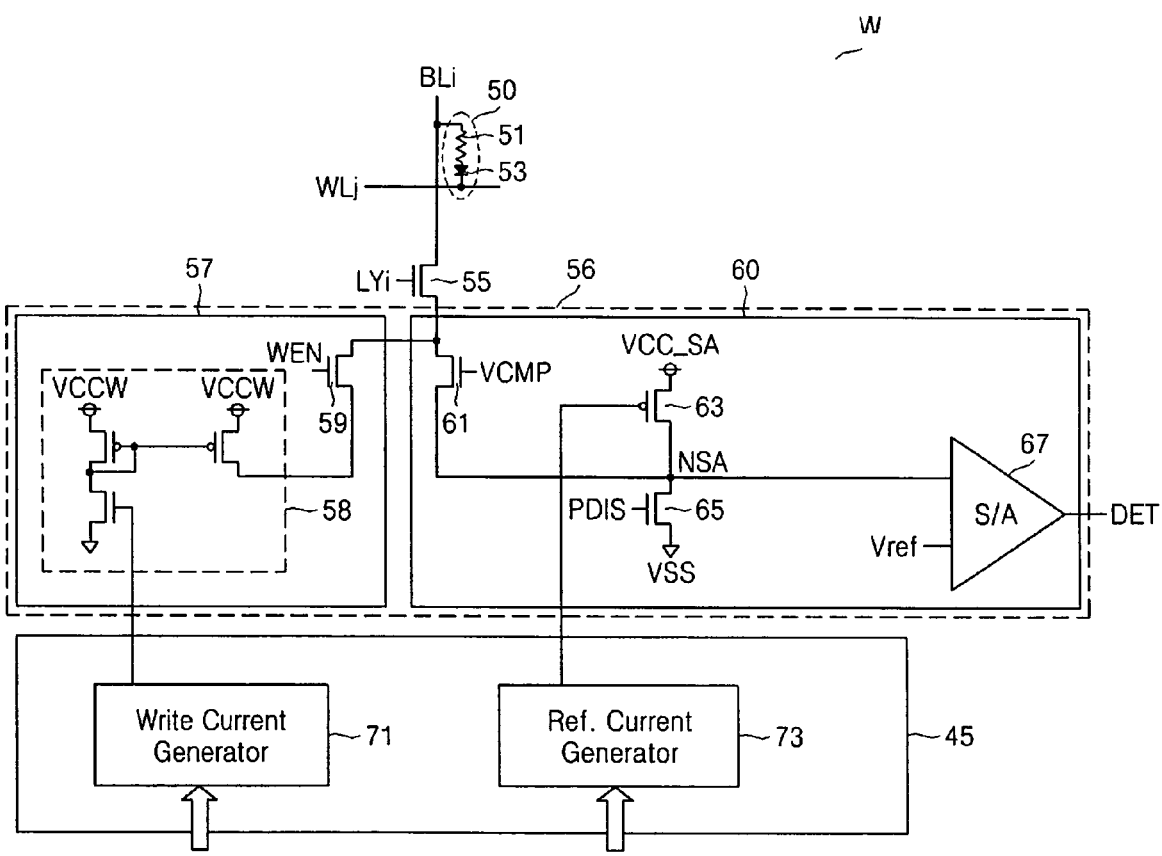
FIG. 3 illustrates a detailed circuit diagram of a portion "W" of FIG. 2.

FIG. 1 illustrates a block diagram of a semiconductor device 10 according to an exemplary embodiment of the present inventive concept. FIG. 2 illustrates a circuit diagram of a memory cell block 12 of FIG. 1. FIG. 3 illustrates a detailed circuit diagram of a portion "W" of FIG. 2.

Referring to FIGS. 1-3, the semiconductor device 10 according to the present exemplary embodiment may include the memory cell block 12, a main column decoder 14, a main row decoder 16, a peripheral circuit 18, an internal control circuit 20, an I/O buffer 22, an address register 24, a status register Ready/Busy 26, a data bus 28, a high voltage generator HV GEN 30, and an external controller 32. The main row decoder 16 and the main column decoder 14 may be located within the memory cell block 12. The semiconductor device 10 except for the external controller 32 may be embodied in a single memory chip.

The memory cell block may include at least one memory cell array 40, at least one row decoder 41, at least one column decoder 43, and at least one read/write circuit 56. The memory cell array 40 may include a plurality of bit lines BLi, where "i" is a natural number, a plurality of word lines WLj, where "j" is a natural number, and a plurality of resistive memory cells 50.

Each of the resistive memory cells 50 may use a resistance value of a resistive memory device 51 to store one or more bits of data. For example, while the resistive memory device 51 programmed to have a high resistance value may express a logic "1" data bit value, the resistive memory device 51 programmed to have a low resistance value may express a logic "0" data bit value. Also, the vise versa may be valid.

Each of the resistive memory cells 50 may include the resistive memory device 51 and an access device 53 to control current flowing in the resistive memory device 51. According to the embodiments, the resistive memory device 51 is referred to as a memory cell or a memory material.

Also, each of the resistive memory cells 50 may be embodied by a phase change random access memory (PRAM). The PRAM which is referred to as a PCRAM or an ovonic unified memory (OUM) may use a phase change material, for example, chalcogenide alloy, for the resistive memory device 51. In this case, the resistive memory device 51 is referred to as a chalcogenide device.

Also, the resistive memory device 51 may be embodied by a phase change material having a different resistance value according to a crystalline state or an amorphous state. For example, the phase change material may be a material of a compound of two elements, for example, GaSb, InSb, InSe, $Sb_2Te_3$, or GeTe, a material of a compound of three elements, for example, GeSbTe, GaSeTe, InSeTe, $SnSb_2Te_4$, or InSbGe, or a material of a compound of four elements, for example, AgInSbTe, (GnSn)SbTe, GeSb(SeTe), or $Te_{81}Ge_{15}Sb_2S_2$.

An access device 53, which is referred to as an isolation device, may be embodied by a diode type, a MOSFET type, or a BJT (Bipolar Junction Transistor) type. Although in the present specification the access device 53 of a diode type is illustrated for convenience of explanation, the present inventive concept is not limited to the diode type.

The row decoder 41 may select at least one word line (or row) among the word lines WLj by decoding a row address output from the main row decoder 16. The column decoder 43 may select at least one bit line (or column) among the bit lines BLi by decoding a column address output from the main column decoder 14.

The read/write circuit 56 may write data to the resistive memory cell 50, or verify read or read data stored in the resistive memory cell 50. The read/write circuit 56 may include a write circuit 57 and a read circuit 60. The write circuit 57 may write a first bit, or a first least significant bit (LSB), of the data stored in the resistive memory cell 50 based on a first reference resistance value, for example, RD2 of FIG. 4A, or a second bit, or a second LSB, of the data based on a second reference resistance value, for example, RD1 or RD3 of FIG. 4B. Details of the write circuit 57 and the read circuit 60 will be described below after various programming examples are explained with reference to FIGS. 4A to 14.

Figure 4A:
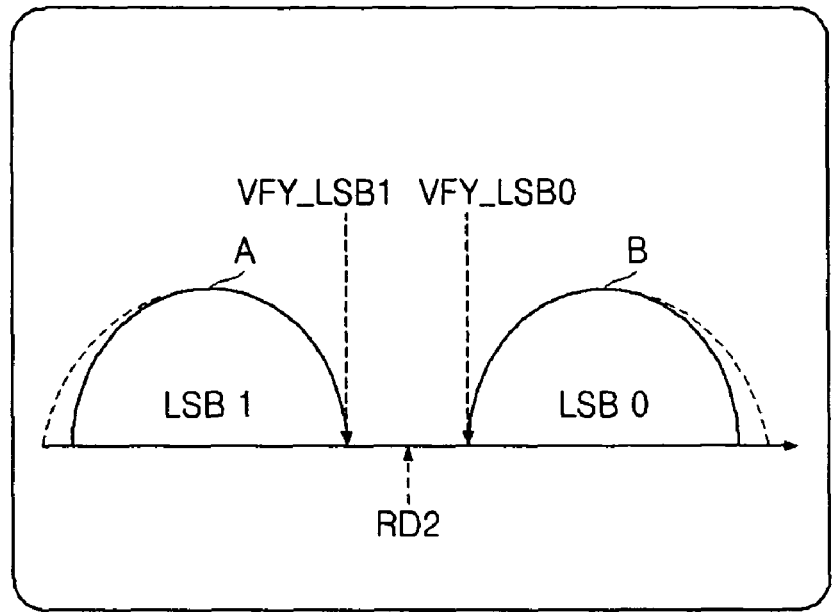
FIGS. 4A and 4B illustrate resistance dispersion diagrams for the program of a memory cell according to an exemplary embodiment of the present inventive concept.
Figure 4B:
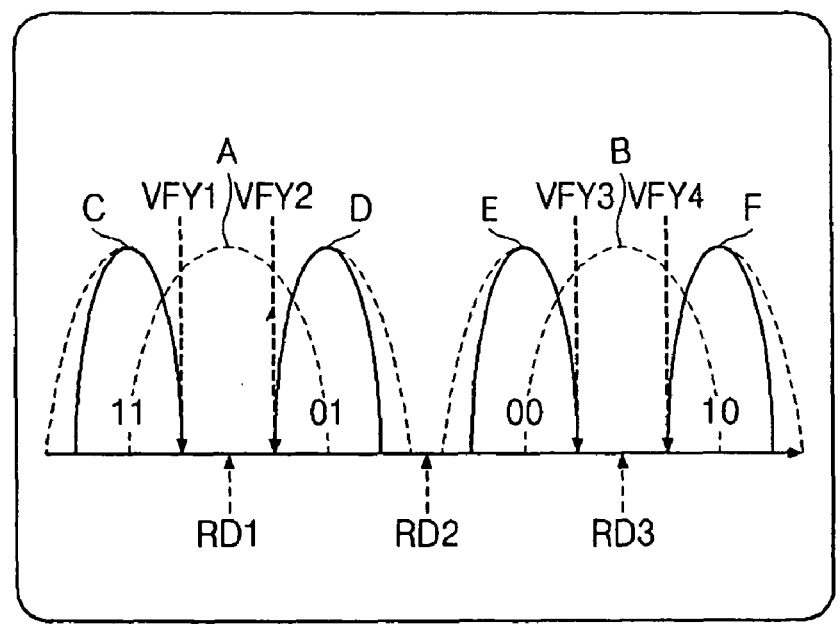
Figure 5A:
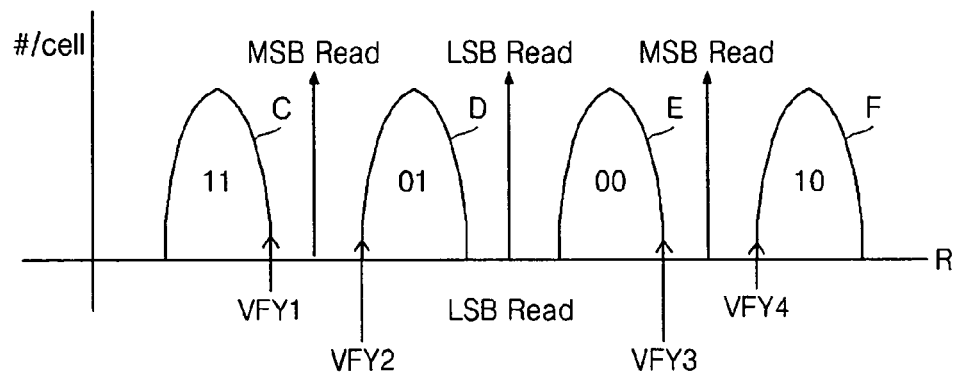
FIGS. 5A, 5B, and 5C illustrate graphs for explaining a process of programming a memory cell based on the resistance dispersion diagrams of FIGS. 4A and 4B.
Figure 5B:
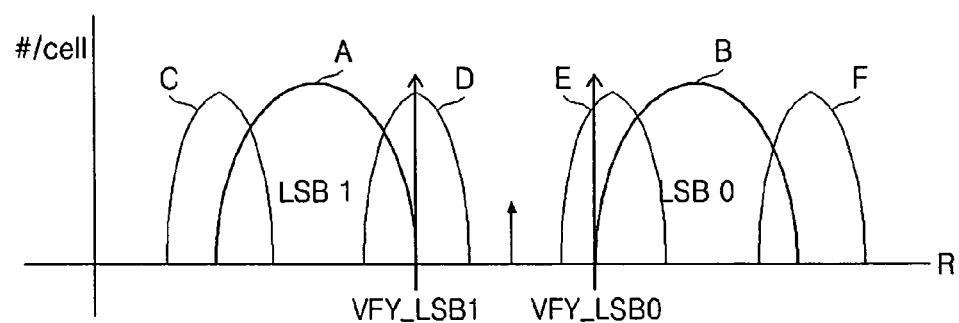
Figure 5C:
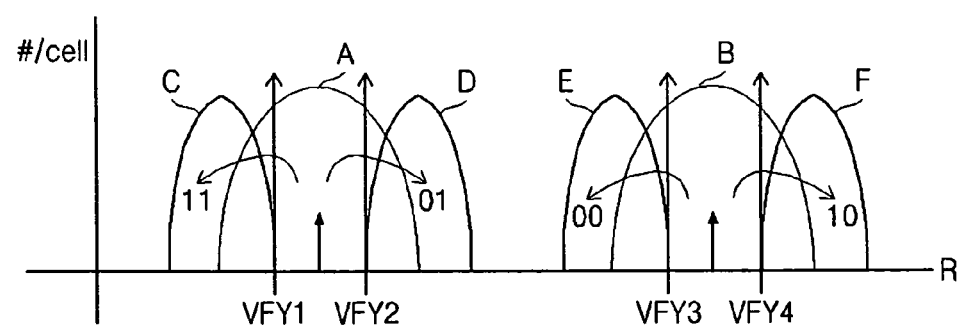

FIGS. 4A and 4B illustrate resistance dispersion diagrams for the program of a memory cell according to an exemplary embodiment of the present inventive concept. FIGS. 5A, 5B, and 5C illustrate graphs for explaining a process of programming a memory cell based on the resistance dispersion diagrams of FIGS. 4A and 4B. Referring to FIGS. 1-3, and 4A and 4B, the write circuit 57 may write data to the resistive memory cell 50 using the resistance dispersion diagrams of FIGS. 4A and 4B.

In detail, when the bit number of the data written to the resistive memory cell 50 is n, where "n" is a natural number, e.g., 2, the write circuit 57 may write the first bit, or the LSB, based on the first and second resistance dispersions A and B and then the second bit, or the most significant bit (MSB), based on the third to sixth resistance dispersions C, D, E, and F.

After the write circuit 57 writes the first bit, or the LSB, based on the first and second resistance dispersions A and B, the read circuit 60 may verify the data written to the resistive memory cell 50 by using a first verification voltage VFY_LSB1 or a second verification voltage VFY_LSB0. Also, after the write circuit 57 writes the second bit, or the MSB, based on the third to sixth resistance dispersions C, D, E, and F, the read circuit 60 may verify the data written to the resistive memory cell 50 by using first to fourth verification voltages VFY1-VFY4. In this case, the first and second resistance dispersions A and B used for writing the first bit may be respectively arranged at the left and right sides of the first reference resistance value RD2, as illustrated in FIG. 4A.

The third and fourth resistance dispersions C and D used for writing the second bit may be respectively arranged at the left and right sides of the second reference resistance RD1. Also, the fifth and sixth resistance dispersions E and F may be respectively arranged at the left and right sides of the third reference resistance RD3. For example, the third resistance dispersion C used for writing the second bit may include the minimum value of the first resistance dispersion A, and the fourth resistance dispersion D may include the maximum value of the first resistance dispersion A, as illustrated in FIG. 4B. Also, the fifth resistance dispersion E may include the minimum value of the second resistance dispersion B. The sixth resistance dispersion F may include the maximum value of the second resistance dispersion B.

That is, in the semiconductor device 10 according to the present embodiment, the program speed and read speed of data may be made fast by changing the program of the first and second bits. Since, during the program of the first and second bits, there is no need to consider a variable resistance dispersion, e.g., those indicated by dotted lines on the first to sixth resistance dispersions, in FIGS. 4A and 4B, a margin of the resistance dispersion may be increased. Also, since the semiconductor device 10 according to the present embodiment uses different programs for the first bit and the second bit, the number of the data write and verify write may be reduced.

When the dispersion of resistance stored in the resistive memory cell 50 corresponds to the third to sixth resistance dispersions C, D, E, and F, as illustrated in FIG. 5A, the program operation performed by the write circuit 57 is described below on the assumption that data corresponding to the third to sixth resistance dispersions C, D, E, and F are "11", "01", "00", and "10", respectively.

When the first bit of the data stored in the resistive memory cell 50 has a first logic level of, for example, a high "1" level, as illustrated in FIG. 5B, the write circuit 57 may control the resistance value, i.e., a resistance value of the resistive memory device 51, stored in the resistive memory cell 50 to be included in the first resistance dispersion A. In this case, the read circuit 60 may perform a verify write operation to the resistive memory cell 50 by using the first verification voltage VFY_LSB1.

Also, when the first bit of the data stored in the resistive memory cell 50 has a second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY_LSB0.

Also, the write circuit 57 may write the second bit, or the MSB, based on the third to sixth resistance dispersions C, D, E, and F when the writing of the first bit into the resistive memory cell 50 is completed. For example, when the first bit is written with the first logic level of, for example, a high "1" level, and the second bit is programmed to the first logic level of, for example, a high "1" level, as illustrated in FIG. 5C, the write circuit 57 may control the resistance value stored in the resistive memory cell 50 to be included in the third resistance dispersion C. In this case, the read circuit 60 may perform the verify write operation to the resistive memory cell 50 by using the third verification voltage VFY1.

Also, when the first bit is written with the first logic level of, for example, a high "1" level, and the second bit is programmed to the second logic level of, for example, a low "0" level, the write circuit 57 may control the resistance value stored in the resistive memory cell 50 to be included in the fourth resistance dispersion D. In this case, the read circuit 60 may perform the verify write operation to the resistive memory cell 50 by outputting the fourth verification voltage VFY2.

Also, when the first bit is written with the second logic level of, for example, a low "0" level, and the second bit is programmed to the second logic level of, for example, a low "0" level, the write circuit 57 may control the resistance value stored in the resistive memory cell 50 to be included in the fifth resistance dispersion E. In this case, the read circuit 60 may perform the verify write operation to the resistive memory cell 50 by using the fifth verification voltage VFY3.

Also, when the first bit is written with the second logic level of, for example, a low "0" level, and the second bit is programmed to the first logic level of, for example, a high "1" level, the write circuit 57 may control the resistance value stored in the resistive memory cell 50 to be included in the sixth resistance dispersion F. In this case, the read circuit 60 may perform the verify write operation to the resistive memory cell 50 by using the sixth verification voltage VFY4.

To include the resistance value of the resistive memory cell 50 in any one of the first to sixth resistance dispersions A-F, the write circuit 57 and the read circuit 60 may perform a plurality of program operations and verify write operations. As the number of programs increases, characteristics of a program pulse used for writing or programming the first and/or second bit, for example, the duration time of a program pulse and/or a program pulse level (magnitude), may be changed, which will be described later.

Figure 6A:
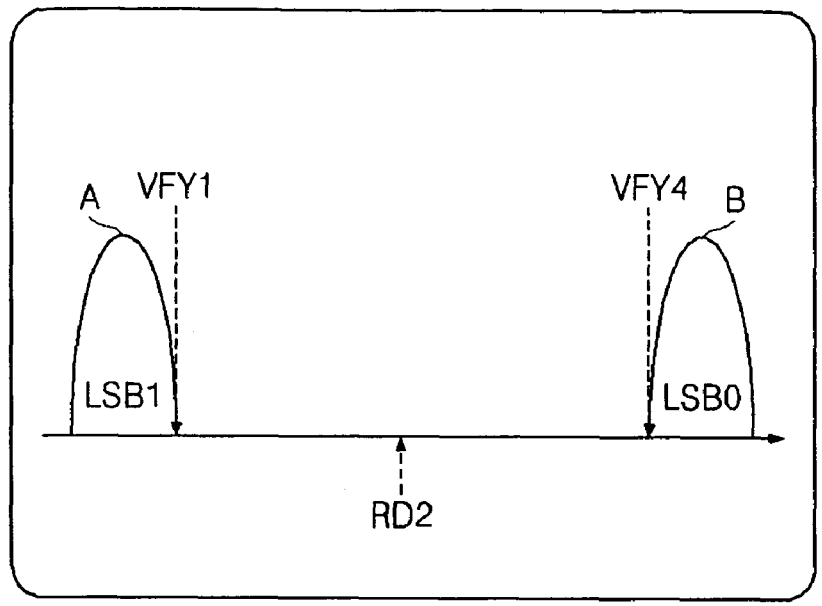
FIGS. 6A and 6B illustrate resistance dispersion diagrams for the program of a memory cell according to another exemplary embodiment of the present inventive concept.
Figure 6B:
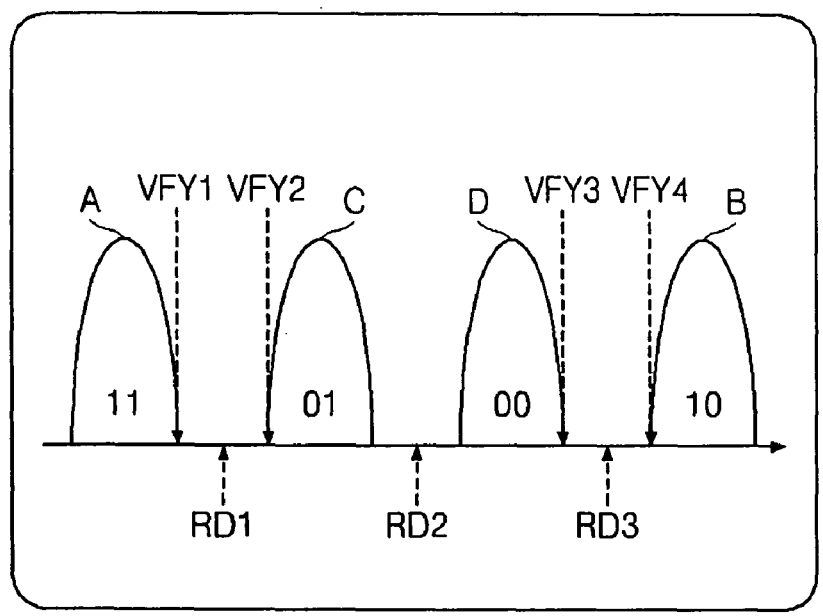
Figure 7A:
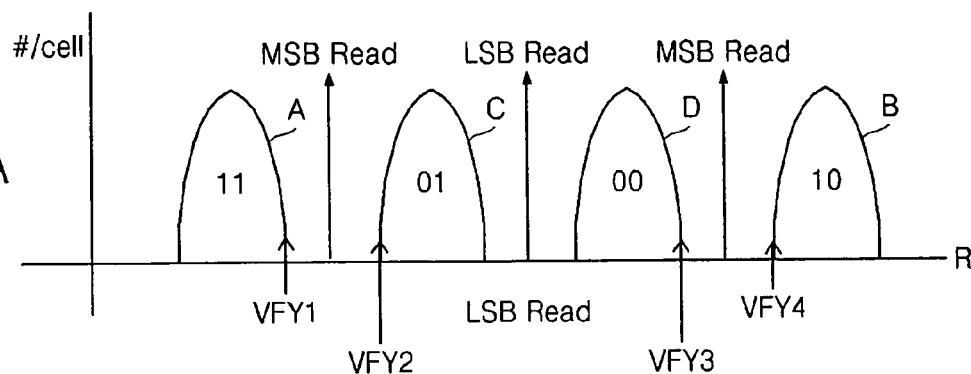
FIGS. 7A, 7B, and 7C illustrate graphs for explaining a process of programming a memory cell based on the resistance dispersion diagrams of FIGS. 6A and 6B.
Figure 7B:
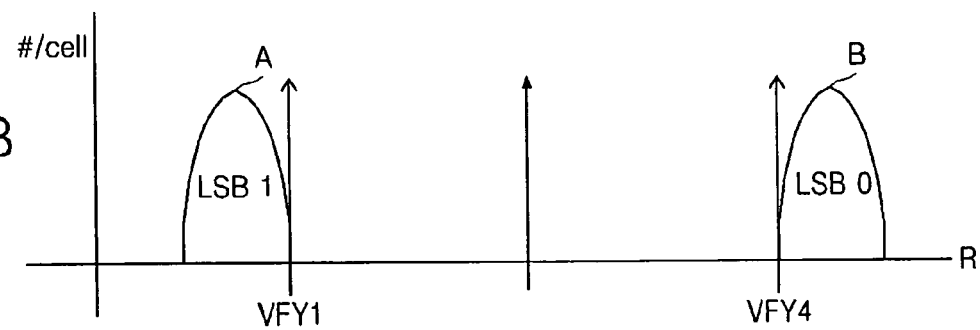
Figure 7C:
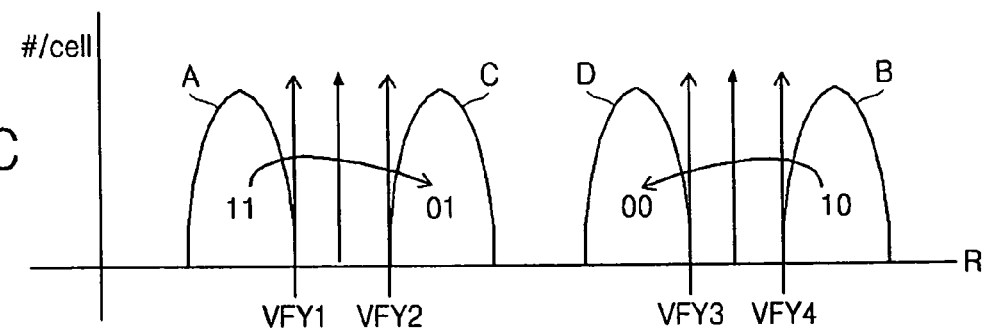

FIGS. 6A and 6B illustrate resistance dispersion diagrams for the program of a memory cell according to another exemplary embodiment of the present inventive concept. FIGS. 7A, 7B, and 7C illustrate graphs for explaining a process of programming a memory cell based on the resistance dispersion diagrams of FIGS. 6A and 6B. Referring to FIGS. 1-3, 6A and 6B, and 7A-7C, the write circuit 57 may write data to the resistive memory cell 50 by using the resistance dispersions of FIGS. 6A and 6B.

In detail, when the bit number of the data written to the resistive memory cell 50 is n, where "n" is a natural number, for example, 2, the write circuit 57 may write the first bit, or the LSB, based on the first resistance dispersion RD2. For example, the write circuit 57 may write the first bit based on the first and second resistance dispersions A and B respectively arranged at the left and right sides of the first reference resistance RD2.

In detail, when the first bit has a first logic level of, for example, a high "1" level, the write circuit 57 may control the distribution of resistance corresponding to the first bit of the resistive memory cell 50 to have the first resistance dispersion A. When the first bit has a second logic level of, for example, a low "0" level, the write circuit 57 may control the distribution of resistance corresponding to the first bit of the resistive memory cell 50 to have the second resistance dispersion B.

After the write circuit 57 writes the first bit, or the LSB, based on the first and second resistance dispersions A and B, the read circuit 60 may verify the data written to the resistive memory cell 50 by using the first verification voltage VFY1 or the second verification voltage VFY2. Also, after the write circuit 57 writes the second bit, or the MSB, based on the first to fourth resistance dispersions A, B, C, and D, the read circuit 60 may verify the data written to the resistive memory cell 50 by using the first to fourth verification voltages VFY1-VFY4. In this case, the first and second resistance dispersions A and B used for writing the first bit may be respectively arranged at the left and right sides of the first reference resistance value RD2, as illustrated in FIG. 6A.

The first and third resistance dispersions A and C used for writing the second bit may be respectively arranged at the left and right sides of the second reference resistance RD1. Also, the fourth and third resistance dispersions D and B may be respectively arranged at the left and right sides of the third reference resistance RD3. For example, the third resistance dispersion C used for writing the second bit of the data written to the resistive memory cell 50 may be located between the maximum value of the first resistance dispersion A and the first reference resistive value RD2, and the fourth resistance dispersion D may be located between the first reference resistive value RD2 and the minimum value of the second resistance dispersion B, as illustrated in FIG. 6B.

When the dispersion of resistance stored in the resistive memory cell 50 is included in each of the first to fourth resistance dispersions A, B, C, and D, as illustrated in FIG. 7A, the program operation performed by the write circuit 57 is described below on the assumption that data corresponding to the first to fourth resistance dispersions A, B, C, and D are "11", "10", "01", and "00", respectively.

When the first bit of the data stored in the resistive memory cell 50 has a first logic level of, for example, a high "1" level, as illustrated in FIG. 7B, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY1.

Also, when the first bit of the data stored in the resistive memory cell 50 has a second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY4.

Also, the write circuit 57 may write the second bit, or the MSB, based on the first to fourth resistance dispersions A, B, C, and D when the writing of the first bit is completed. For example, when the first bit is written with the first logic level of, for example, a high "1" level, and the second bit is programmed to the first logic level of, for example, a high "1" level, as illustrated in FIG. 7C, the write circuit 57 may control the resistance value stored in the resistive memory cell 50 to be included in the first resistance dispersion A. In this case, the read circuit 60 may perform the verify write operation to the resistive memory cell 50 by using the third verification voltage VFY1.

In the present embodiment, the dispersion A of FIG. 7C of the resistance value of the resistive memory cell 50 in which the first and second bits are programmed to "11" is similar to the dispersion A of FIG. 7B of the resistance value of the resistive memory cell 50 after the first bit is programmed to "1". Thus, when the first bit is written with the first logic level of, for example, a high "1" level, and the second bit is programmed to the first logic level of, for example, a high "1" level, as illustrated in FIG. 7C, an additional program to the resistive memory cell 50 may not be needed.

Also, when the first bit is written with the first logic level of, for example, a high "1" level and then the second bit is programmed to the second logic level of, for example, a low "0" level, the write circuit 57 may control the resistance value stored in the resistive memory cell 50 to be included in the third resistance dispersion C. In this case, the read circuit 60 may perform the verify write operation to the resistive memory cell 50 by using the third verification voltage VFY2.

Also, when the first bit is written with the second logic level of, for example, a low "0" level and then the second bit is programmed to the first logic level of, for example, a high "1" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY4.

In the present embodiment, the dispersion B of FIG. 7C of the resistance value of the resistive memory cell 50 in which the first and second bits are programmed to "10" is similar to the dispersion B of FIG. 7B of the resistance value of the resistive memory cell 50 after the first bit is programmed to "0". Thus, when the first bit is written with the second logic level of, for example, a low "0" level, and the second bit is programmed to the first logic level of, for example, a high "1" level, as illustrated in FIG. 7C, an additional program to the resistive memory cell 50 may not be needed.

Also, when the first bit is written with the second logic level of, for example, a low "0" level and then the second bit is programmed to the second logic level of, for example, a low "0" level, the write circuit 57 may control the resistance value stored in the resistive memory cell 50 to be included in the fourth resistance dispersion D. In this case, the read circuit 60 may perform the verify write operation to the resistive memory cell 50 by using the fourth verification voltage VFY3.

Figure 8A:
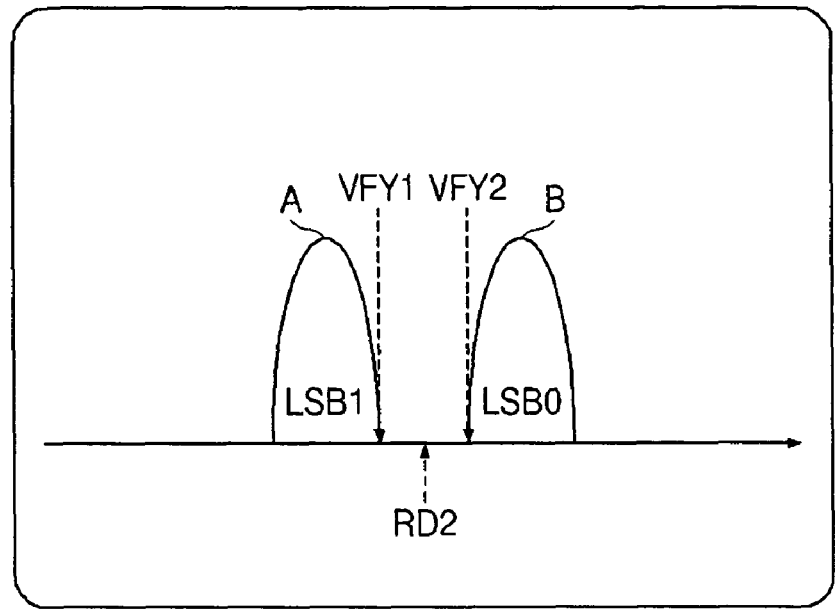
FIGS. 8A and 8B illustrate resistance dispersion diagrams for the program of a memory cell according to another exemplary embodiment of the present inventive concept.
Figure 8B:
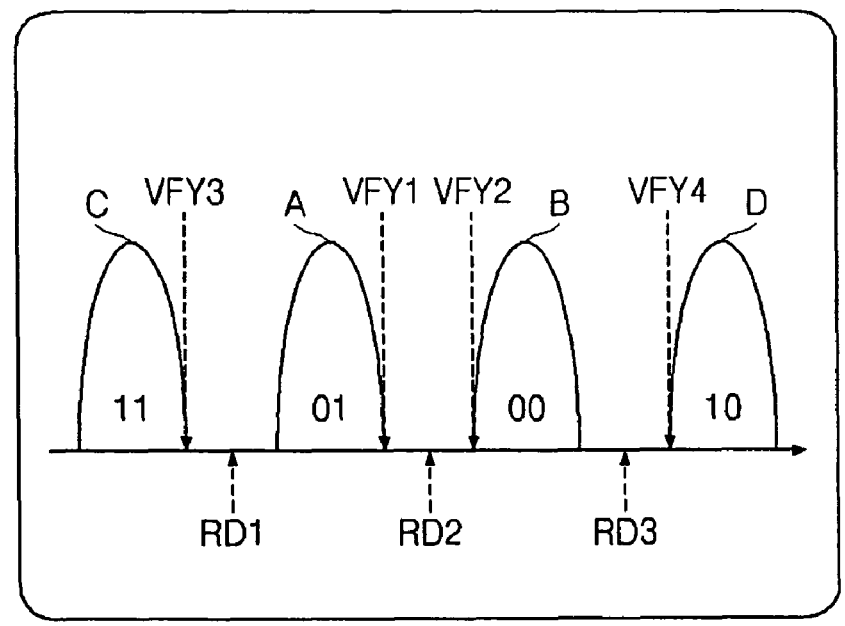
Figure 9A:
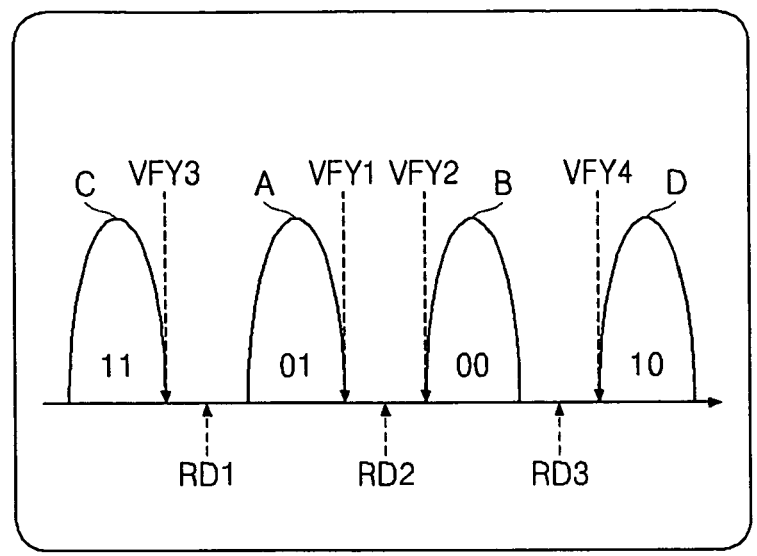
FIGS. 9A, 9B, and 9C illustrate graphs for explaining a process of programming a memory cell based on the resistance dispersion diagrams of FIGS. 8A and 8B.
Figure 9B:
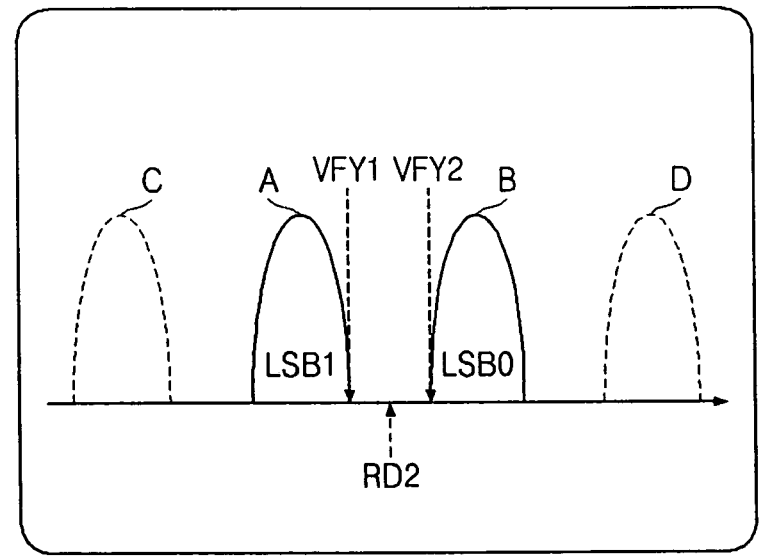
Figure 9C:
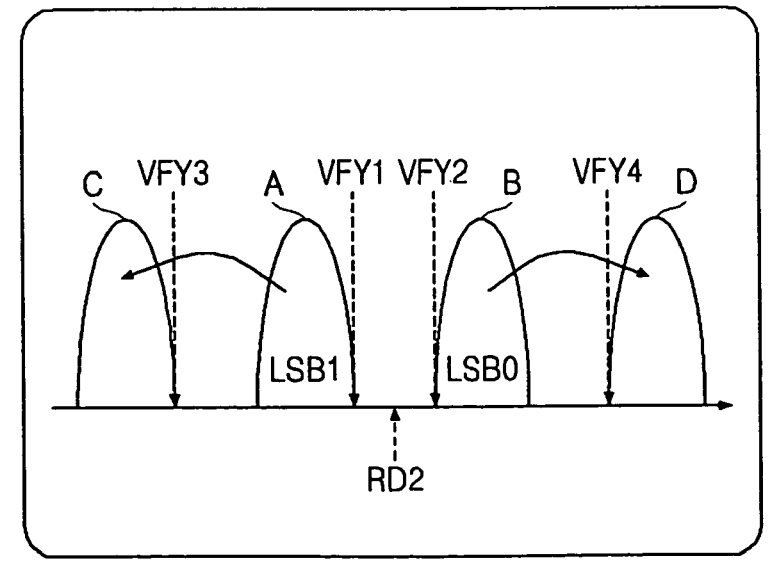

FIGS. 8A and 8B illustrate resistance dispersion diagrams for the program of a memory cell according to another exemplary embodiment of the present inventive concept. FIGS. 9A, 9B, and 9C illustrate graphs for explaining a process of programming a memory cell based on the resistance dispersion diagrams of FIGS. 8A and 8B. Referring to FIGS. 1-3, 8A and 8B, and 9A-9C, the write circuit 57 may write data to the resistive memory cell 50 by using the resistance dispersions of FIGS. 8A and 8B.

In detail, when the bit number of the data written to the resistive memory cell 50 is n, where "n" is a natural number, for example, 2, the write circuit 57 may write the first bit, or the LSB, based on the first resistance dispersion RD2. For example, the write circuit 57 may write the first bit based on the first and second resistance dispersions A and B respectively arranged at the left and right sides of the first reference resistance RD2.

In detail, when the first bit has a first logic level of, for example, a high "1" level, the write circuit 57 may control the distribution of resistance corresponding to the first bit of the resistive memory cell 50 to have the first resistance dispersion A. When the first bit has a second logic level of, for example, a low "0" level, the write circuit 57 may control the distribution of resistance corresponding to the first bit of the resistive memory cell 50 to have the second resistance dispersion B.

After the write circuit 57 writes the first bit, or the LSB, based on the first and second resistance dispersions A and B, the read circuit 60 may verify the data written to the resistive memory cell 50 by using the first verification voltage VFY1 or the second verification voltage VFY2. Also, after the write circuit 57 writes the second bit, or the MSB, based on the first to fourth resistance dispersions A, B, C, and D, the read circuit 60 may verify the data written to the resistive memory cell 50 by using the first to fourth verification voltages VFY1-VFY4. In this case, the first and second resistance dispersions A and B used for writing the first bit may be respectively arranged at the left and right sides of the first reference resistance value RD2, as illustrated in FIG. 8A.

The first and third resistance dispersions A and C used for writing the second bit may be respectively arranged at the left and right sides of the second reference resistance RD1. Also, the fourth and third resistance dispersions D and B may be respectively arranged at the left and right sides of the third reference resistance RD3. For example, the maximum value of the third resistance dispersion C used for writing the second bit of the data written to the resistive memory cell 50 may be less than the minimum value of the first resistance dispersion A and the minimum value of the fourth resistance dispersion D may be greater than the maximum value of the second resistance dispersion B, as illustrated in FIG. 8B.

When the dispersion of resistance stored in the resistive memory cell 50 is included in each of the first to fourth resistance dispersions A, B, C, and D, as illustrated in FIGS. 9A, 9B, and 9C, the program operation performed by the write circuit 57 is described below on the assumption that data corresponding to the first to fourth resistance dispersions A, B, C, and D are "01", "00", "11", and "10", respectively, as illustrated in FIG. 9A.

When the first bit of the data stored in the resistive memory cell 50 has a first logic level of, for example, a high "1" level, as illustrated in FIG. 9B, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY1.

Also, when the first bit of the data stored in the resistive memory cell 50 has a second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY2.

Also, the write circuit 57 may write the second bit, or the MSB, based on the first to fourth resistance dispersions A, B, C, and D when the writing of the first bit is completed. For example, when the first bit is written with the first logic level of, for example, a high "1" level, and the second bit is programmed to the first logic level of, for example, a high "1" level, as illustrated in FIG. 9C, the write circuit 57 may control the resistance value stored in the resistive memory cell 50 to be included in the third resistance dispersion C. In this case, the read circuit 60 may perform the verify write operation to the resistive memory cell 50 by using the third verification voltage VFY3.

When the first bit is written with the first logic level of, for example, a high "1" level, and the second bit is programmed to the second logic level of, for example, a low "0" level, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY1.

In the present embodiment, the dispersion A of FIG. 9C of the resistance value of the resistive memory cell 50 in which the first and second bits are programmed to "01" is similar to the dispersion A of FIG. 9B of the resistance value of the resistive memory cell 50 after the first bit is programmed to "1". Thus, when the first bit is written with the first logic level of, for example, a high "1" level, and the second bit is programmed to the second logic level of, for example, a low "0" level, as illustrated in FIG. 9C, an additional program to the resistive memory cell 50 may not be needed.

Also, when the first bit is written with the second logic level of, for example, a low "0" level and then the second bit is programmed to the first logic level of, for example, a high "1" level, the write circuit 57 may control the resistance value stored in the resistive memory cell 50 to be included in the fourth resistance dispersion D. In this case, the read circuit 60 may perform the verify write operation to the resistive memory cell 50 by using the fourth verification voltage VFY4.

Also, when the first bit is written with the second logic level of, for example, a low "0" level and then the second bit is programmed to the second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY2.

In the present embodiment, the dispersion B of FIG. 9C of the resistance value of the resistive memory cell 50 in which the first and second bits are programmed to "00" is similar to the dispersion B of FIG. 9B of the resistance value of the resistive memory cell 50 after the first bit is programmed to "0". Thus, when the first bit is written with the second logic level of, for example, a low "0" level, and the second bit is programmed to the second logic level of, for example, a low "0" level, as illustrated in FIG. 9C, an additional program to the resistive memory cell 50 may not be needed.

Figure 10A:
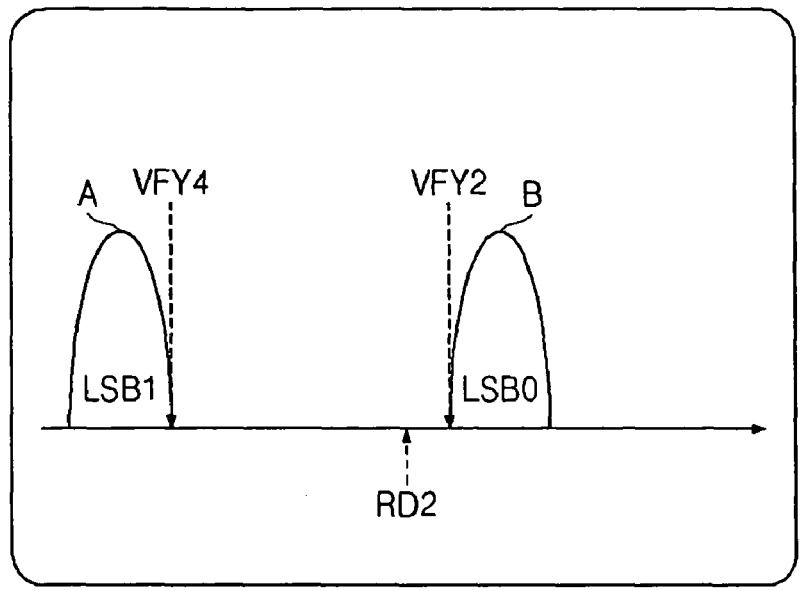
FIGS. 10A and 10B illustrate resistance dispersion diagrams for the program of a memory cell according to another exemplary embodiment of the present inventive concept.
Figure 10B:
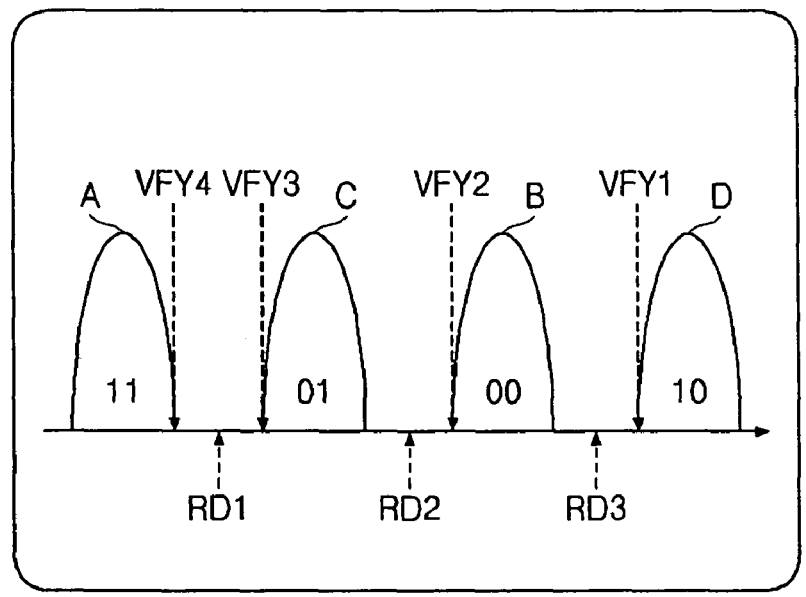
Figure 11A:
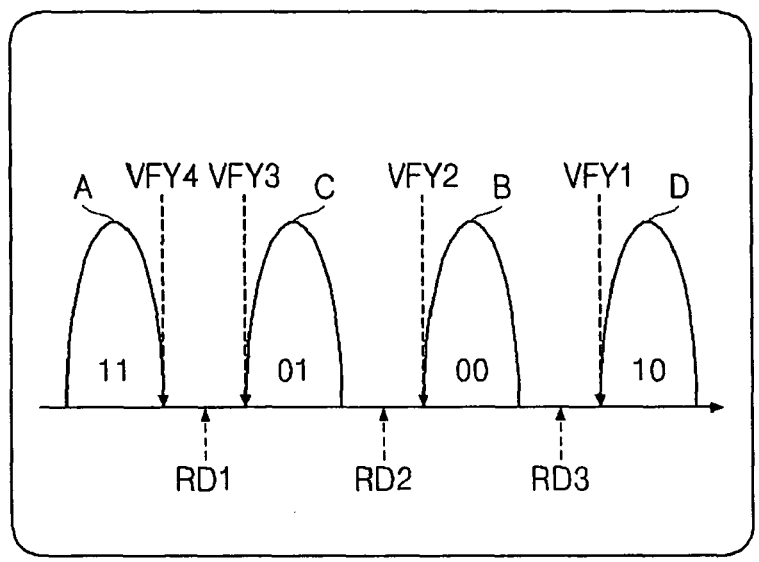
FIGS. 11A, 11B, and 11C illustrate graphs for explaining a process of programming a memory cell based on the resistance dispersion diagrams of FIGS. 10A and 10B.
Figure 11B:
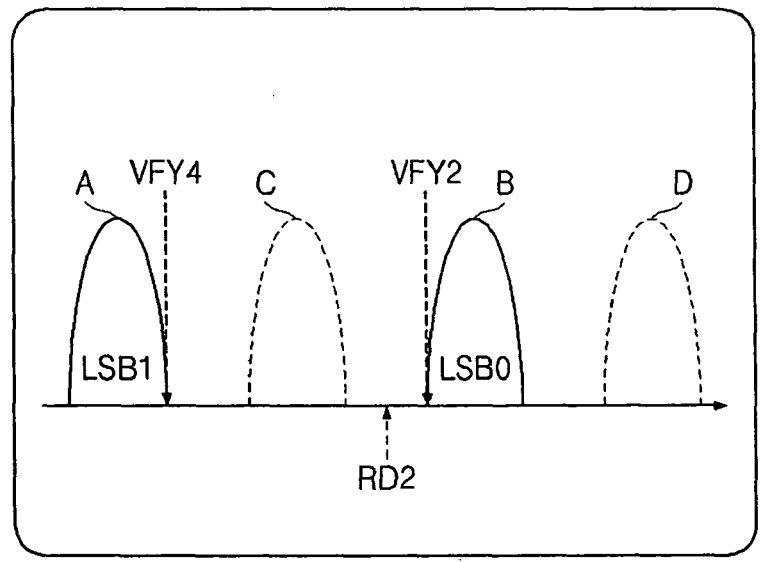
Figure 11C:
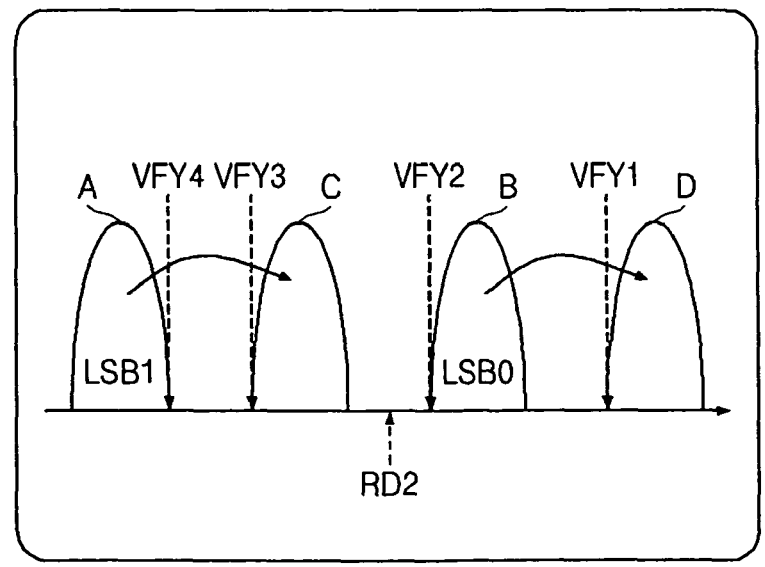

FIGS. 10A and 10B illustrate resistance dispersion diagrams for the program of a memory cell according to another exemplary embodiment of the present inventive concept. FIGS. 11A, 11B, and 11C illustrate graphs for explaining a process of programming a memory cell based on the resistance dispersion diagrams of FIGS. 10A and 10B. Referring to FIGS. 1-3, 10A and 10B, and 11A-11C, the write circuit 57 may write data to the resistive memory cell 50 by using the resistance dispersions of FIGS. 10A and 10B.

In detail, when the bit number of the data written to the resistive memory cell 50 is n, where "n" is a natural number, for example, 2, the write circuit 57 may write the first bit, or the LSB, based on the first resistance dispersion RD2. For example, the write circuit 57 may write the first bit based on the first and second resistance dispersions A and B respectively arranged at the left and right sides of the first reference resistance RD2.

In detail, when the first bit has a first logic level of, for example, a high "1" level, the write circuit 57 may control the distribution of resistance corresponding to the first bit of the resistive memory cell 50 to have the first resistance dispersion A. When the first bit has a second logic level of, for example, a low "0" level, the write circuit 57 may control the distribution of resistance corresponding to the first bit of the resistive memory cell 50 to have the second resistance dispersion B.

After the write circuit 57 writes the first bit, or the LSB, based on the first and second resistance dispersions A and B, the read circuit 60 may verify the data written to the resistive memory cell 50 by using the first verification voltage VFY4 or the second verification voltage VFY2. Also, after the write circuit 57 writes the second bit, or the MSB, based on the first to fourth resistance dispersions A, B, C, and D, the read circuit 60 may verify the data written to the resistive memory cell 50 by using the first to fourth verification voltages VFY1-VFY4.

The minimum value of the third resistance dispersion C used for writing the second bit of the data written to the resistive memory cell 50 may be greater than the maximum value of the first resistance dispersion A, but less than the first reference resistance value RD2, and the minimum value of the fourth resistance dispersion D may be greater than the maximum value of the second resistance dispersion B, as illustrated in FIG. 10B.

When the dispersion of resistance stored in the resistive memory cell 50 is included in each of the first to fourth resistance dispersions A, B, C, and D, as illustrated in FIGS. 11A, 11B, and 11C, the program operation performed by the write circuit 57 is described below on the assumption that data corresponding to the first to fourth resistance dispersions A, B, C, and D are "11", "00", "01", and "10", respectively, as illustrated in FIG. 11A.

When the first bit of the data stored in the resistive memory cell 50 has a first logic level of, for example, a high "1" level, as illustrated in FIG. 11B, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY4.

Also, when the first bit of the data stored in the resistive memory cell 50 has a second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY2.

Also, the write circuit 57 may write the second bit, or the MSB, based on the first to fourth resistance dispersions A, B, C, and D when the writing of the first bit is completed. For example, when the first bit is written with the first logic level of, for example, a high "1" level, and the second bit is programmed to the first logic level of, for example, a high "1" level, as illustrated in FIG. 11C, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY4.

When the first bit is written with the first logic level of, for example, a high "1" level, and the second bit is programmed to the second logic level of, for example, a low "0" level, the write circuit 57 may control the resistance value stored in the resistive memory cell 50 to be included in the third resistance dispersion C. In this case, the read circuit 60 may perform the verify write operation to the resistive memory cell 50 by using the third verification voltage VFY3.

Also, when the first bit is written with the second logic level of, for example, a low "0" level and then the second bit is programmed to the first logic level of, for example, a high "1" level, the write circuit 57 may control the resistance value stored in the resistive memory cell 50 to be included in the fourth resistance dispersion D. In this case, the read circuit 60 may perform the verify write operation to the resistive memory cell 50 by using the fourth verification voltage VFY1.

Also, when the first bit is written with the second logic level of, for example, a low "0" level and then the second bit is programmed to the second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY2.

In the present embodiment, the dispersion A of FIG. 11C of the resistance value of the resistive memory cell 50 in which the first and second bits are programmed to "11" and the dispersion B of FIG. 11C of the resistance value of the resistive memory cell 50 in which the first and second bits are programmed to "00" are respectively similar to the dispersion A of FIG. 11B of the resistance value of the resistive memory cell 50 after the first bit is programmed to "1" and the dispersion B of FIG. 11B of the resistance value of the resistive memory cell 50 after the first bit is programmed to "0".

Figure 12A:
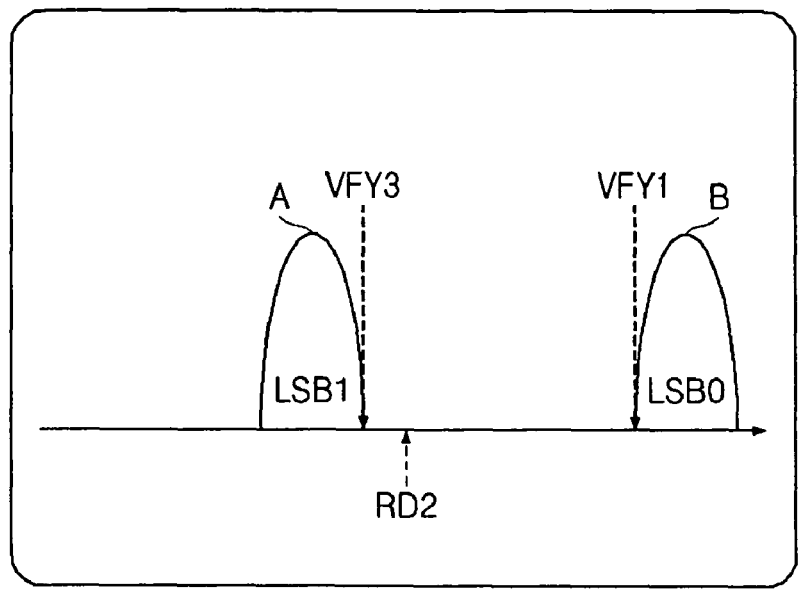
FIGS. 12A and 12B illustrate resistance dispersion diagrams for the program of a memory cell according to another exemplary embodiment of the present inventive concept.
Figure 12B:
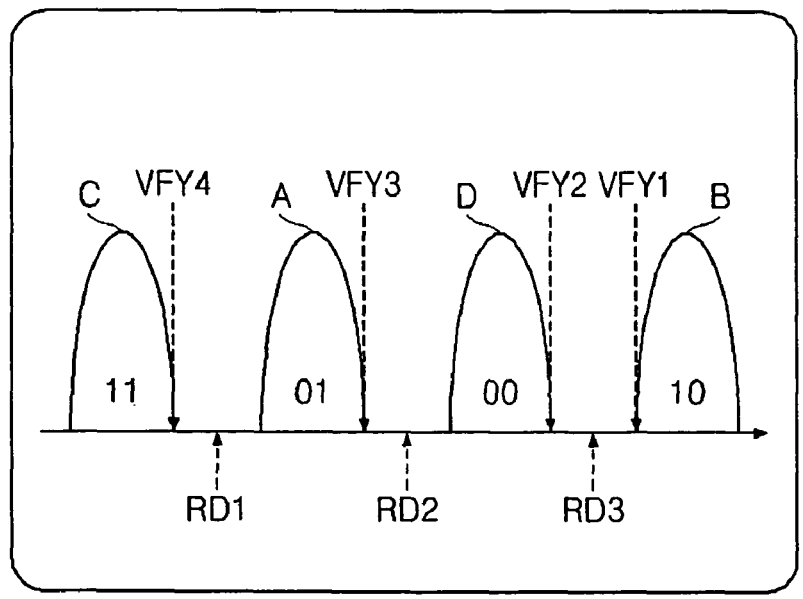
Figure 13A:
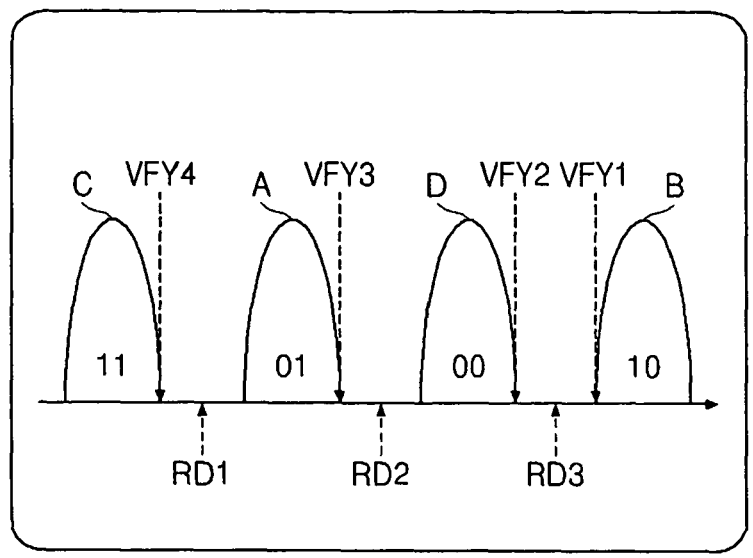
FIGS. 13A, 13B, and 13C illustrates graphs for explaining a process of programming a memory cell based on the resistance dispersion diagrams of FIGS. 12A and 12B.
Figure 13B:
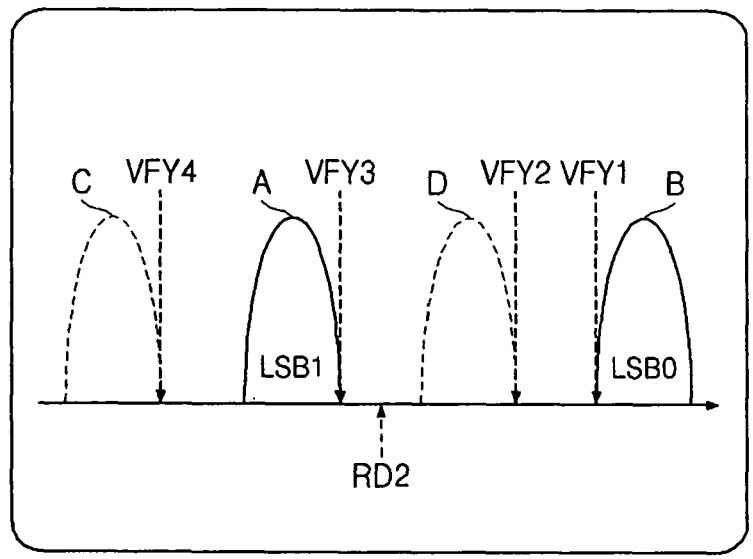
Figure 13C:
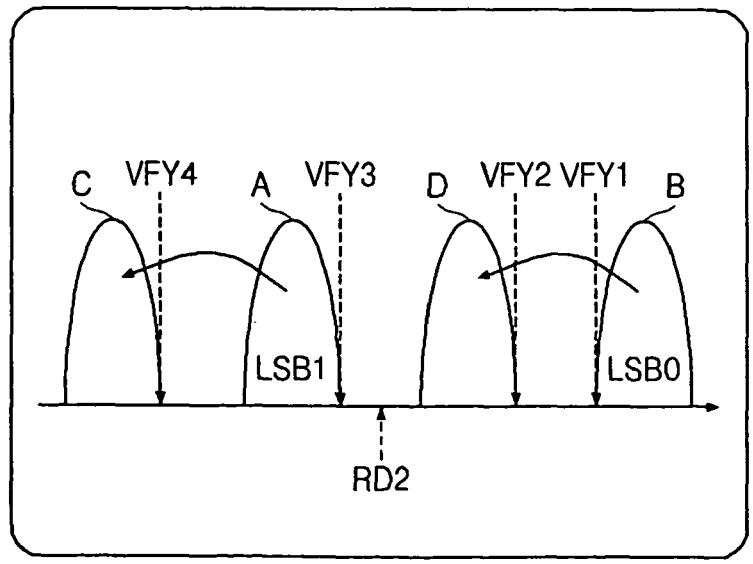

FIGS. 12A and 12B illustrate resistance dispersion diagrams for the program of a memory cell according to another exemplary embodiment of the present inventive concept. FIGS. 13A, 13B, and 13C illustrate graphs for explaining a process of programming a memory cell based on the resistance dispersion diagrams of FIGS. 12A and 12B. Referring to FIGS. 1-3, 12A and 12B, and 13A-13C, the write circuit 57 may write data to the resistive memory cell 50 by using the resistance dispersions of FIGS. 12A and 12B.

In detail, when the bit number of the data written to the resistive memory cell 50 is n, where "n" is a natural number, for example, 2, the write circuit 57 may write the first bit, or the LSB, based on the first resistance dispersion RD2. For example, the write circuit 57 may write the first bit based on the first and second resistance dispersions A and B respectively arranged at the left and right sides of the first reference resistance RD2.

In detail, when the first bit has a first logic level of, for example, a high "1" level, the write circuit 57 may control the distribution of resistance corresponding to the first bit of the resistive memory cell 50 to have the first resistance dispersion A. When the first bit has a second logic level of, for example, a low "0" level, the write circuit 57 may control the distribution of resistance corresponding to the first bit of the resistive memory cell 50 to have the second resistance dispersion B.

After the write circuit 57 writes the first bit, or the LSB, based on the first and second resistance dispersions A and B, the read circuit 60 may verify the data written to the resistive memory cell 50 by using the first verification voltage VFY3 or the second verification voltage VFY1. Also, after the write circuit 57 writes the second bit, or the MSB, based on the first to fourth resistance dispersions A, B, C, and D, the read circuit 60 may verify the data written to the resistive memory cell 50 by using the first to fourth verification voltages VFY1-VFY4. In this case, the first and second resistance dispersions A and B used for writing the first bit may be respectively arranged at the left and right sides of the first reference resistance value RD2, as illustrated in FIG. 12A.

The first and third resistance dispersions A and C used for writing the second bit may be respectively arranged at the left and right sides of the second reference resistance value RD1. The fourth and third resistance dispersions D and B used for writing the second bit may be respectively arranged at the left and right sides of the third reference resistance value RD3. For example, the maximum value of the third resistance dispersion C used for writing the second bit of the data written to the resistive memory cell 50 may be less than the minimum value of the first resistance dispersion A. The fourth resistance dispersion D may be located between the first reference resistance value RD2 and the minimum value of the second resistance dispersion B.

When the dispersion of resistance stored in the resistive memory cell 50 is included in each of the first to fourth resistance dispersions A, B, C, and D, as illustrated in FIGS. 13A, 13B, and 13C, the program operation performed by the write circuit 57 is described below on the assumption that data corresponding to the first to fourth resistance dispersions A, B, C, and D are "11", "01", "00", and "10", respectively, as illustrated in FIG. 13A.

When the first bit of the data stored in the resistive memory cell 50 has a first logic level of, for example, a high "1" level, as illustrated in FIG. 13B, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY3.

Also, when the first bit of the data stored in the resistive memory cell 50 has a second logic level of, for example, a low "0" level, the write circuit 57 may control the resistance value stored in the resistive memory cell 50 to be included in the second resistance dispersion B. In this case, the read circuit 60 may perform the verify write operation to the resistive memory cell 50 by using the second verification voltage VFY1.

Also, the write circuit 57 may write the second bit, or the MSB, based on the first to fourth resistance dispersions A, B, C, and D when the writing of the first bit is completed. For example, when the first bit is written with the first logic level of, for example, a high "1" level, and the second bit is programmed to the first logic level of, for example, a high "1"

level, as illustrated in FIG. 13C, the write circuit 57 may control the resistance value stored in the resistive memory cell 50 to be included in the third resistance dispersion C. In this case, the read circuit 60 may perform the verify write operation to the resistive memory cell 50 by using the third verification voltage VFY4.

When the first bit is written with the first logic level of, for example, a high "1" level, and the second bit is programmed to the second logic level of, for example, a low "0" level, the write circuit 57 may control the resistance value stored in the resistive memory cell 50 to be included in the first resistance dispersion A. In this case, the read circuit 60 may perform the verify write operation to the resistive memory cell 50 by using the first verification voltage VFY3.

Also, when the first bit is written with the second logic level of, for example, a low "0" level and then the second bit is programmed to the first logic level of, for example, a high "1" level, the write circuit 57 may control the resistance value stored in the resistive memory cell 50 to be included in the second resistance dispersion B. In this case, the read circuit 60 may perform the verify write operation to the resistive memory cell 50 by using the first verification voltage VFY1.

Also, when the first bit is written with the second logic level of, for example, a low "0" level and then the second bit is programmed to the second logic level of, for example, a low "0" level, the write circuit 57 may control the resistance value stored in the resistive memory cell 50 to be included in the fourth resistance dispersion D. In this case, the read circuit 60 may perform the verify write operation to the resistive memory cell 50 by using the fourth verification voltage VFY2.

In the present embodiment, the dispersion A of FIG. 13C of the resistance value of the resistive memory cell 50 in which the first and second bits are programmed to "01" and the dispersion B of FIG. 13C of the resistance value of the resistive memory cell 50 in which the first and second bits are programmed to "10" are respectively similar to the dispersion A of FIG. 13B of the resistance value of the resistive memory cell 50 after the first bit is programmed to "1" and the dispersion B of FIG. 13B of the resistance value of the resistive memory cell 50 after the first bit is programmed to "0".

Figure 14:
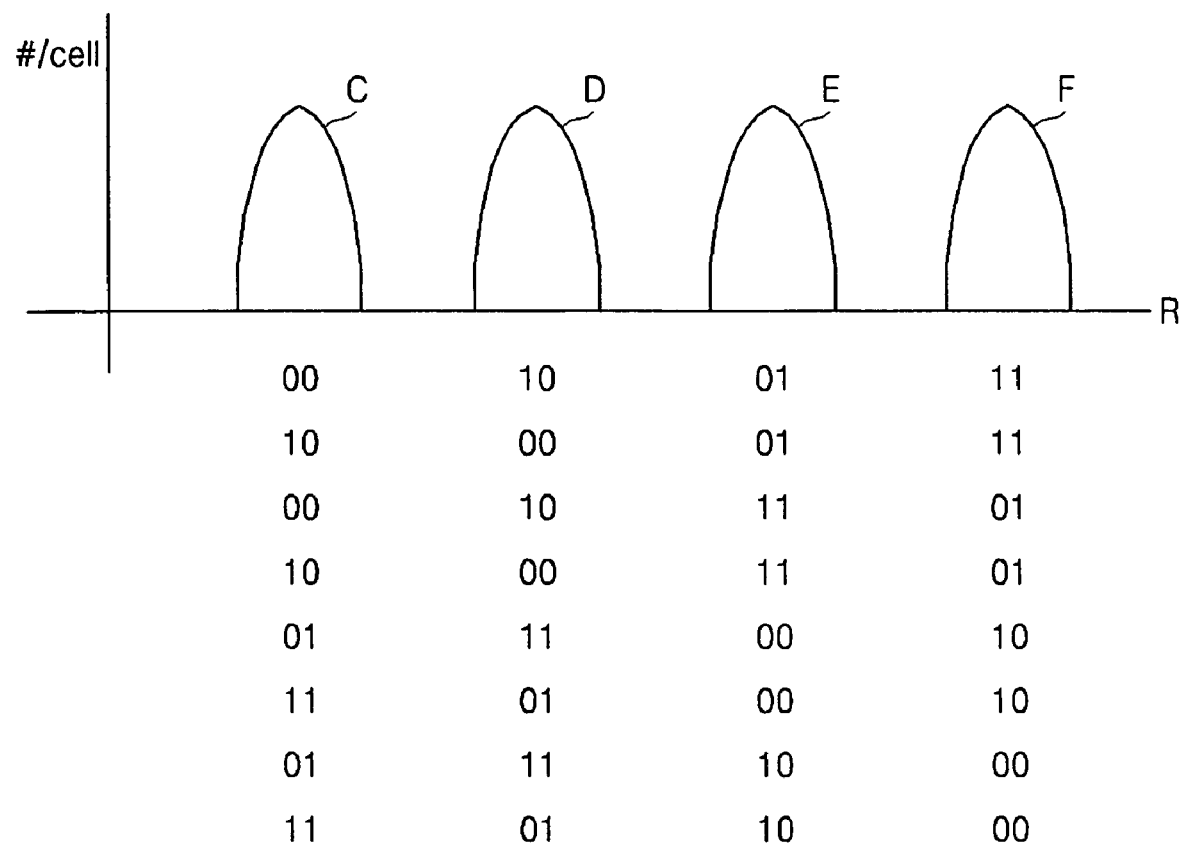
FIG. 14 is a graph illustrating a case of data that may be written to a memory cell according to an exemplary embodiment of the present inventive concept.

FIG. 14 illustrates a graph of a case of data that may be written to a memory cell according to an exemplary embodiment of the present inventive concept. Referring to FIG. 14, the resistance dispersion, for example, the third to sixth resistance dispersions C, D, E, and F of FIG. 4B, corresponding to the resistance value stored in the resistive memory cell 50 are, for example, "11", "01", "00", and "10" in order of resistance gradually increasing. The data, for example, the first to fourth data, may correspond to any one of the first to eighth cases in the following Table.

TABLE

|  | 1$^{st}$ data | 2$^{nd}$ data | 3$^{rd}$ data | 4$^{th}$ data |
| --- | --- | --- | --- | --- |
| 1$^{st}$ case | 00 | 10 | 01 | 11 |
| 2$^{nd}$ case | 10 | 00 | 01 | 11 |
| 3$^{rd}$ case | 00 | 10 | 11 | 01 |
| 4$^{th}$ case | 10 | 00 | 11 | 01 |
| 5$^{th}$ case | 01 | 11 | 00 | 10 |
| 6$^{th}$ case | 11 | 01 | 00 | 10 |
| 7$^{th}$ case | 01 | 11 | 10 | 00 |
| 8$^{th}$ case | 11 | 01 | 10 | 00 |

Referring again to FIG. 3, the write circuit 57 may include a current mirror 58 and a first switch 59. The current mirror 58 may mirror write current flowing in a reference branch to a mirror current branch connected to the bit line BLi via the first switch 59, in response to a write control signal generated by a write control signal generator 71.

The first switch 59 may transmit the write current generated by the current mirror 58 to the bit line BLi in response to a write enable signal WEN. The read circuit 60 may detect and amplify a voltage corresponding to the current output from the resistive memory cell 50 via the bit line BLi during the read operation or the verify read operation. The read circuit 60 may read or verify read data stored in the resistive memory cell 50 based on the resistance dispersion described in detail through FIGS. 4A-13C.

For example, in the cases illustrated in FIG. 4A-5C, the read circuit 60 may compare a first read current corresponding to the first reference resistance RD2 and a pass-through current flowing through the resistive memory cell 50 transmitted through the bit line BLi, and detect the first bit, for example, the LSB, of the resistive memory cell 50 based on a result of the comparison.

For example, when the current flowing in the bit line BLi is greater than the first read current, the read circuit 60 may detect the first bit having a first logic level, for example, a high "1" level, state. Also, when the current flowing in the bit line BLi is less than the first read current, the read circuit 60 may detect the first bit having a second logic level, for example, a low "0" level, state.

Next, the read circuit 60 may detect the second bit according to the detected first bit. When the detected first bit has the first logic level, for example, a high "1" level, the read circuit 60 compares a second read current corresponding to the first reference resistance RD1 and the pass-through current flowing in the resistive memory cell 50, and detect the second bit, for example, the MSB, of the resistive memory cell 50 based on a result of the comparison.

For example, when the current flowing in the bit line BLi is greater than the second read current, the read circuit 60 may detect the second bit having a first logic level, for example, a high "1" level, state. Also, when the current flowing in the bit line BLi is less than the second read current, the read circuit 60 may detect the first bit having a second logic level, for example, a low "0" level, state.

When the detected first bit has the second logic level, for example, a low "0" level, the read circuit 60 compares a third read current corresponding to the third reference resistance RD3 and the pass-through current flowing in the resistive memory cell 50 and transmitted via the bit line BLi, and detect the second bit, for example, the MSB, of the resistive memory cell 50 based on a result of the comparison.

The method of reading data stored in the resistive memory cell 50 that is programmed in the methods according to the above-described embodiments may be achieved by the above-described method so that a detailed description thereof may be omitted herein.

The read circuit 60 may include a clamp circuit 61, a precharge circuit 63, a discharge circuit 65, and a sense amplifier 67. The clamp circuit 61 may clamp a bit line BLi voltage during the reading of the data stored in the resistive memory cell 50. Also, the clamp circuit 61 may function as a presence amplifier to detect the bit line BLi voltage according to the data stored in the resistive memory cell 50.

The precharge circuit 63 may precharge a sensing node NSA connected to the bit line BLi to a first voltage VCC_SA, in response to the reference current generated by the reference current generator 73. The discharge circuit 65 may discharge at least one of bit lines BL1-BLi to a second voltage Vss, in response to a discharge control signal PDIS. The sense amplifier 67 may compare a voltage of the sensing node NSA and a reference voltage Vref, and output a result of the comparison DET.

Referring again to FIG. 1, the main column decoder 14 may output an address signal to select at least one of bit lines (or column) among the bit lines BLi of the at least one memory cell array 40 formed in the memory cell block 12, in response to a column address transmitted from the address register 24. The main row decoder 16 may output an address signal to select at least one of word lines (or row) among the word lines WLj of the at least one memory cell array 40 formed in the memory cell block 12, in response to a row address transmitted from the address register 24.

The peripheral circuit 18 may be connected to the bit lines BLi of the memory cell block 12 and may output a control signal for writing or reading data and maintain or latch the written data. Also, the peripheral circuit 18 may receive, via the data bus 28, the data that is received from the I/O buffer 22 and written to the resistive memory cell 50 in FIG. 3. For example, the peripheral circuit 18 may include an analog circuit portion 45, a first interface 47, and a second interface 49, as illustrated in FIG. 2.

Figure 18:
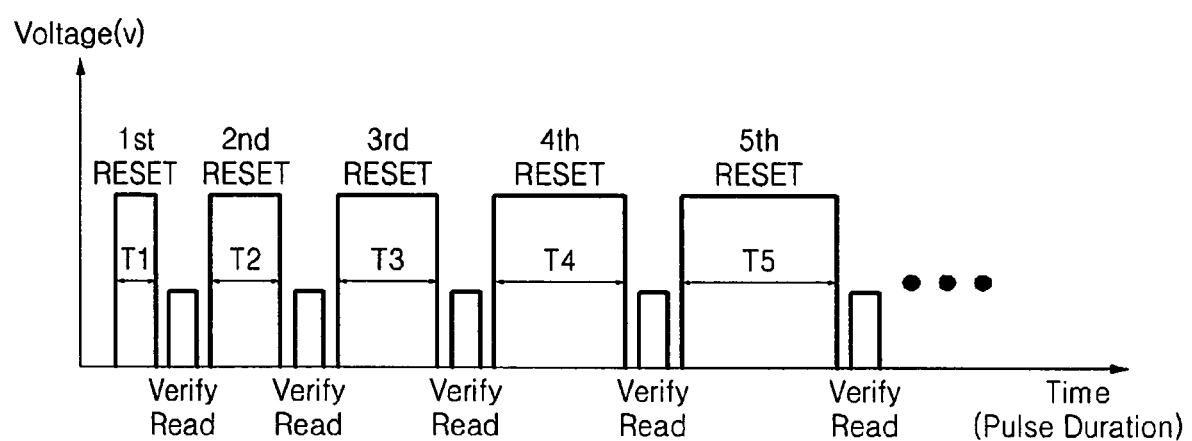
FIG. 18 illustrates a waveform diagram of a voltage pulse signal according to an exemplary embodiment of the present invention.
Figure 19:
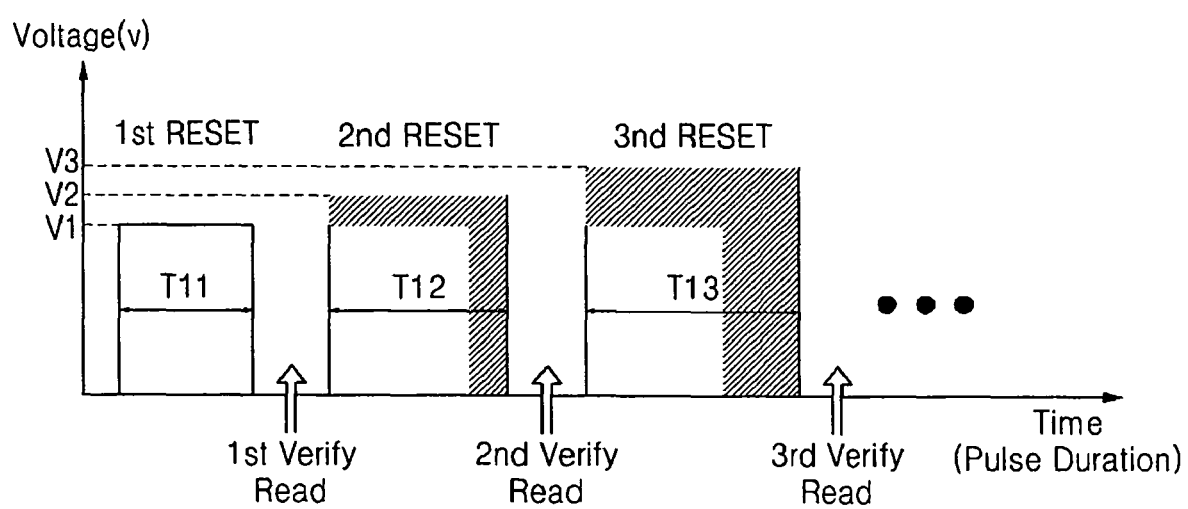
FIG. 19 illustrates a waveform diagram of a voltage pulse signal according to another exemplary embodiment of the present invention.

The analog circuit portion 45 may receive various commands transmitted from an internal control circuit 20 through the second interface 49, output a control signal for writing or reading data based on a received command, and maintain or latch the written data. The analog circuit portion 45 may include a write control signal generator 71 and a reference circuit generator 73, as illustrated in FIG. 3. The write control signal generator 71 may output a write control signal in response to a write command transmitted from the internal control circuit 20. The reference current generator 73 may output a reference current in response to the write command transmitted from the internal control circuit 20. In the present embodiment, the write control signal may be deformed to a write current signal or a write voltage signal. The write control signal may be variable according to the number of programming as illustrated in FIG. 18 or 19, which will be described later.

The analog circuit portion 45 may further include a latch (not shown) for maintaining or latching data written to the resistive memory cell 50. A circuit including the analog circuit 45, the write circuit 57, and the read circuit 60 is referred to as a control block for convenience of explanation.

Referring again to FIG. 2, the first interface 47 may be a core interface, and may perform a function of exchanging the write control signal, the reference current, the program data or the write data, or the read data between the write/read circuit 56 and the analog circuit portion 45. The second interface 49 may be a host interface, and may perform a function of exchanging the write control signal, the reference current, the write data or the program data, or the read data among the analog circuit portion 45 of FIG. 2, and the internal control circuit 20 and the I/O buffer 22 of FIG. 1

The internal control circuit 20 may control the sequence of data write and erasure and the determination of data, based on an external control signal and command provided according to the operation mode. The I/O buffer 22 may interface an input/output (I/O) address generated by the external controller 32 and transmit the command cmd generated by the external controller 32 to the internal control circuit 20.

The address register 24 may transmit the address add, for example, a row or column address, output from the I/O buffer 22 to the main row decoder 16 and/or the main column decoder 14. The status register 26 may set a ready/busy signal R/B indicating whether the memory chip is in a ready status or a busy status, and output the ready/busy signal R/B to the outside of the chip.

The high voltage generator HV GEN 30 may generate a plurality of voltages higher than a power voltage according to the operation mode of the semiconductor device 10. The high voltage generator HV GEN 30 may be controller by the internal control circuit 20.

Figure 15:
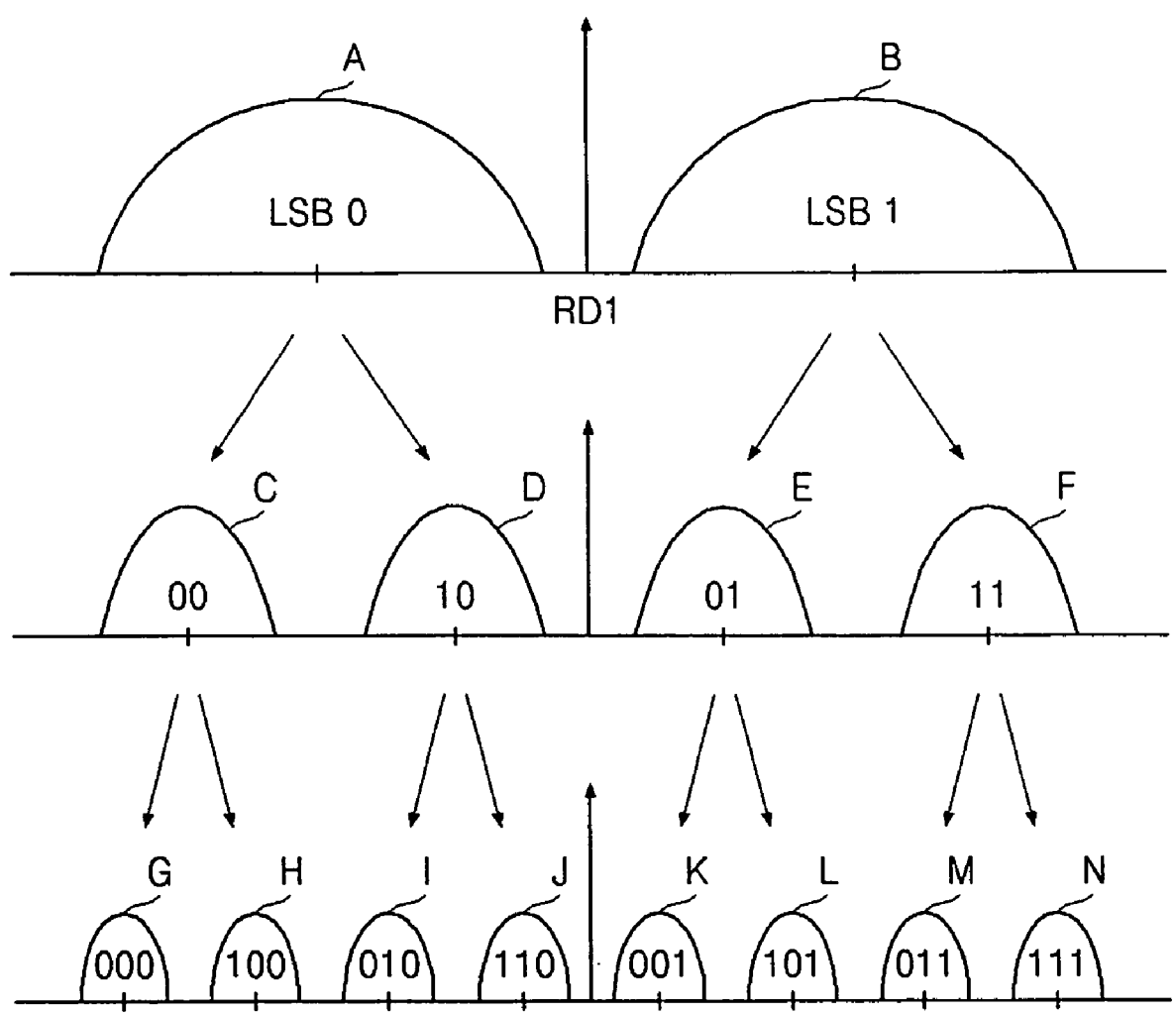
FIG. 15 illustrates resistance dispersion diagram for the program of a memory cell according to another exemplary embodiment of the present inventive concept.

FIG. 15 illustrates a resistance dispersion diagram for the program of a memory cell according to another exemplary embodiment of the present inventive concept. Referring to FIG. 15, the resistive memory cell 50 according to the present embodiment may store 3-bit data, i.e., n may equal 3. The write circuit 57 may program the 3-bit data using first to fourteenth resistance dispersions A-N.

The first to fourteenth resistance dispersions A-N may be classified into groups having different first bits, or the LSBs, with respect to the first reference resistance RD1. For example, each of first group resistance dispersions A, C, D, G, H, I, and J may have the first bit having the second logic level, for example, a low "0" level. Also, each of second group resistance dispersions B, E, F, K, L, M, and N may have the first bit having the first logic level, for example, a low "1" level.

To program the first bit, or the LSB, the write circuit 57 may use the first and second resistance dispersions A and B, as illustrated in FIG. 15. Also, to program the second bit, the write circuit 57 may use the third to sixth resistance dispersions C, D, E, and F, as illustrated in FIG. 15. Finally, to program the third bit, or the MSB, the write circuit 57 may use the seventh to fourteenth resistance dispersions G, H, I, J, K, L, M, and N, as illustrated in FIG. 15.

Since those skilled in the art to which the present inventive concept belongs to may sufficiently understand the method in which the write circuit 57 programs the 3-bit data using the resistance dispersions of FIG. 15, through the above-described method of programming 2-bit data, a detailed description thereof will be not be repeated.

Figure 16:
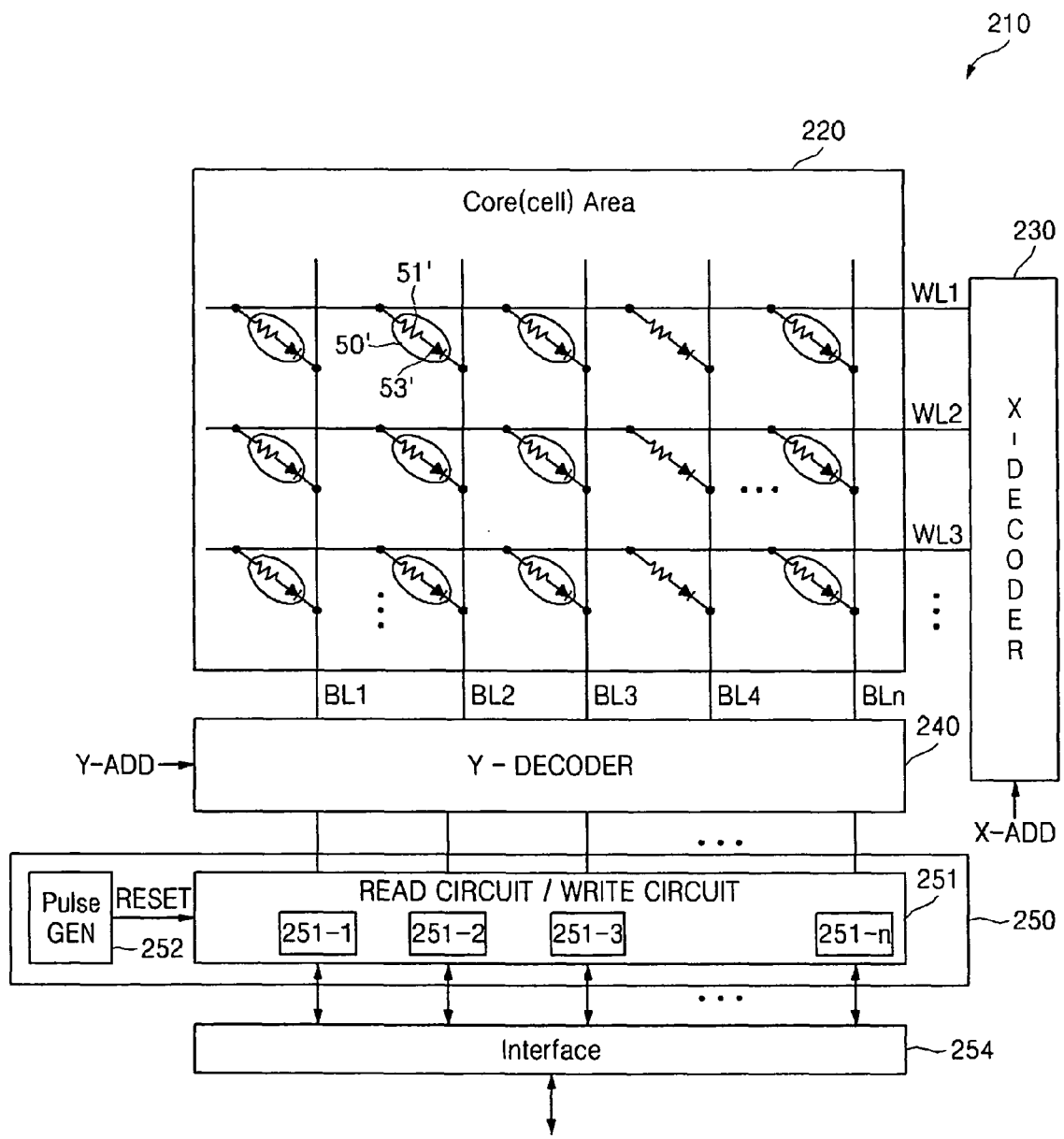
FIG. 16 illustrates block diagram of a semiconductor system according to another exemplary embodiment of the present inventive concept.

FIG. 16 illustrates a block diagram of a semiconductor system according to another exemplary embodiment of the present inventive concept. Referring to FIG. 16, a semiconductor device 210 may include a memory cell array 220, a row decoder 230, a column decoder 240, a control block 250, and a host interface 254. The semiconductor device 210 may further include the I/O buffer 22, the address register 24, the status register 26, the data bus 28, and the high voltage generator HV GEN 30.

The memory cell array 220 includes the plurality of bit lines BL1-BLi, where "i" is a natural number, the plurality of word lines WL1, WL2, WL3, . . . and a plurality of resistive memory cells 50', like the memory cell array 40 of FIG. 2. Each of resistive memory cells 50' include a resistive memory device 51' and an access device 53' for controlling current flowing in the resistive memory device 51', like the resistive memory cell 50 of FIG. 3.

The row decoder 230 selects at least one word line, or a row, of the word lines WL1, WL2, and WL3, . . . by decoding a row address X-ADD. The column decoder 240 selects at least one bit line, or a column, of the bit lines BL1-BLi by decoding a column address Y-ADD.

When the characteristic, for example, a resistance value, of the resistive memory device 51' changes according to a pulse duration of a pulse signal RESET, the control block 250 may control that the program operation and the verify reading operation may be repeated while increasing a program time, or the pulse duration, to program or write program data or write data to the resistive memory cell 50' according to the resistance value of the resistive memory cell 50', as illustrated in FIG. 18 or 19. The program operation or write operation signifies to change the resistance value of the resistive memory device 51' of the resistive memory cell 50' to a high resistance value or a low resistance value by supplying a voltage pulse or a current pulse to the resistive memory device 51'.

The control block 250 may include a data processing circuit 251 which will be described with reference to FIG. 17. The control block 250 may include a pulse generator 252 for generating the pulse signal RESET. For example, the pulse generator 252 may generate the pulse signal RESET in which the program time, or the pulse duration or a pulse width, increases as the number of the program operation, for example, a reset operation, increases, as illustrated in FIG. 18.

Also, the pulse generator 252 may generate the pulse signal RESET in which the program time and a program voltage increase together as the number of the program operation, for example, a reset operation, increases, as illustrated in FIG. 19. That is, the control block 250 according to the present embodiment may increase at least one of the program time and the program voltage according as the number of the program operation increases or a program loop of a program cycle increases, to control a threshold voltage distribution or a resistance distribution.

Thus, the control block 250 according to the present embodiment may apply an incremental step pulse programming (ISPP) scheme to the program time (see FIG. 18), or the ISPP scheme to both of the program time and the program voltage (see FIG. 19), in the program operation. The host interface 254 may perform a function of exchanging the program data, or the write data, or the read data between the control block 250 and a host (not shown).

Figure 17:
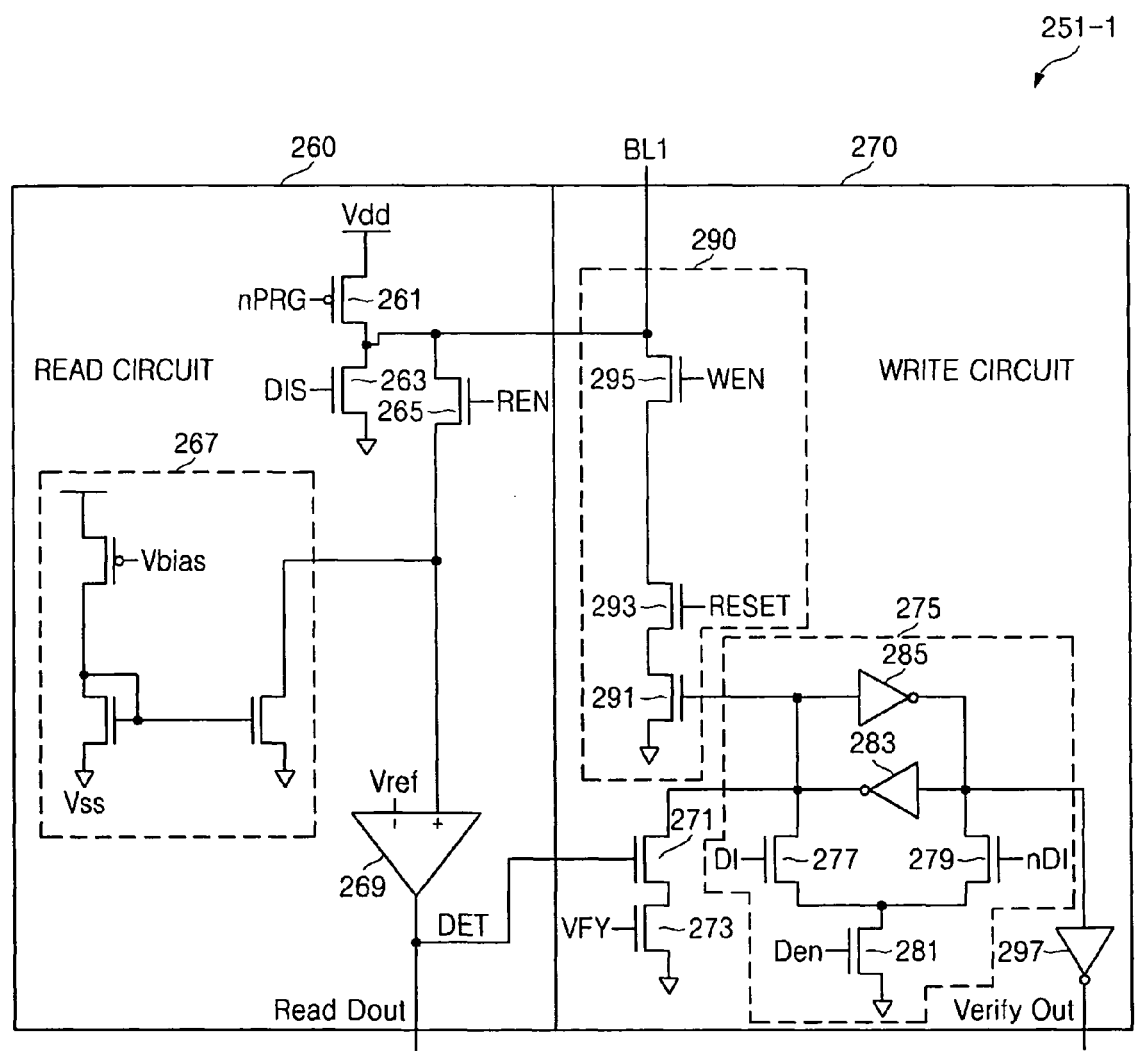
FIG. 17 illustrates a circuit diagram of a control block of FIG. 16.

FIG. 17 illustrates a circuit diagram of a control block of FIG. 16 according to an embodiment. Referring to FIG. 17, although a read/write circuit 251-1 connected to a bit line BL1 is illustrated for convenience of explanation, the data processing circuit 251 includes a plurality of read/write circuits 251-1 to 251-*i*, where "i" is a natural number. The structure and operation of each of the read/write circuits 251-2 to 251-*i* are substantially the same as those of the read/write circuit 251-1.

The read/write circuit 251-1 may include a read circuit 260 and a write circuit 270. The read circuit 260 that is referred to as a read detection amplifier detects and amplifies a voltage corresponding to the current output from the resistive memory cell 50' via the bit line BL1 during the read operation or the verify read operation, and output a detection voltage DET. The detection voltage DET controls the operation of the write circuit 270.

For example, when the resistance value of the resistive memory cell 50' is in a high resistance state, a logic "1" data bit value is stored in the resistive memory cell 50'. When the resistance value of the resistive memory cell 50' is in a low resistance state, a logic "0" data bit value is stored in the resistive memory cell 50'. Also, the vice versa may be valid.

Thus, when the resistance value of the resistive memory cell 50' is in a high resistance state, the pass-through current flowing in the resistive memory cell 50' is low. When the resistance value of the resistive memory cell 50' is in a low resistance state, the pass-through current flowing in the resistive memory cell 50' is high.

The read circuit 260 may include a precharge circuit 261, a discharge circuit 263, a switching circuit 265, a current mirror 267, and a voltage comparator 269. The precharge circuit 261 precharges at least one of the bit lines BL1-BL*i* to a first voltage Vdd in response to a precharge control signal nPRG.

The discharge circuit 263 discharges at least one of the bit lines BL1-BL*i* to a second voltage Vss in response to a discharge control signal DIS.

The first voltage Vdd to set the resistive memory cell 50' to a logic "1" data bit value may be higher than the second voltage Vss to set the resistive memory cell 50' to a logic "0" data bit value. The second voltage Vss may be a ground voltage.

The switching circuit 265 supplies the current flowing in the bit line BL1 to the voltage comparator 269 in response to a read enable signal REN during the read operation or a verify read operation. The current mirror 267 mirrors a reference current flowing in a reference branch to a mirror current branch connected to a first input terminal, for example, a (+) input terminal, of the voltage comparator 269, in response to a bias voltage Vbias.

The voltage comparator 269 compares a voltage at the first input terminal, for example, a voltage generated by the pass-through current of the resistive memory cell 50', and the reference voltage Vref that is input to a second input terminal, for example, a (−) input terminal, and generates the detection voltage DET as a result of the comparison.

For example, when the operation of programming, writing, or storing the logic "1" data bit value in the resistive memory cell 50' is defined to be a set operation, during the set operation, the precharge circuit 261 supplies the first voltage Vdd, for example, a voltage pulse or a current pulse generated by the voltage pulse, to all of the resistive memory cells 50' selected from the resistive memory cells 50' by the row address X-ADD and the column address Y-ADD. Thus, during the set operation, each of the selected resistive memory cells 50' has a high resistance state. That is, the precharge circuit 261 sets all of the resistive memory cells 50' selected during the set operation.

When the operation of programming, writing, or storing the logic "0" data bit value in the resistive memory cell 50' is defined to be a reset operation, during the set operation, a driver 290 of the write circuit 270 supplies a voltage, for example, the second voltage Vss, corresponding to the logic "0" data bit value according to the data latched to a latch portion 275, to the resistive memory cell 50'. Thus, during the reset operation, the resistive memory cell 50' has a lower resistance state. That is, the driver 290 resets the resistive memory cell 50' during the reset operation according to the data latched by the latch portion 275, for example, the logic "0" data bit value.

The operation of the semiconductor device 210 according to the present embodiment is described below with reference to FIGS. 16-18 on the assumption that the resistive memory cell 50' is set, the voltage input to the first input terminal (+) of the voltage comparator 269 is lower than the reference voltage Vref and the resistive memory cell 50' is reset, the voltage input to the first input terminal (+) of the voltage comparator 269 is higher than the reference voltage Vref.

First, during the set operation, the precharge circuit 261 sets all of the selected resistive memory cells 50'. That is, the precharge circuit 261 supplies the first signal, for example, the first voltage, to all of the selected resistive memory cells 50'. Thus, the logic '1' data bit value is stored in each of all of the selected resistive memory cells 50'.

During the verify read operation, since the voltage of the bit line BL1 is lower than the reference voltage Vref, the detection voltage SET has a low level. Thus, a transistor 271 maintains an off state in response to the detection voltage DET having a low level.

When the resistive memory cell 50' connected to the bit line BL1 is to be reset, the write enable signal WEN and the data enable signal Den become a high level, input data DI="0" is input to a gate of the transistor 277, and complementary input data nDI="1" is input to a gate of a transistor 279.

Thus, since each of the transistors 279 and 281 is turned on, the input terminal of an inverter 283 becomes a low level and an output terminal of the inverter 283 becomes a high level. The voltage of the output terminal of the inverter 297 may be used to determine whether the programming or write operation is completed. For example, when the program operation or the write operation is completed by the reset operation, the voltage of the output terminal of the inverter 297 becomes a lower level. Although FIG. 17 illustrates that the write circuit 270 includes the inverter 297, a buffer may be used instead of the inverter 297. According to an embodiment, the write circuit 270 may not include the inverter 297. Thus, since the output terminal of the inverter 283 becomes a high level, a transistor 291 is turned on. That is, to perform a reset operation, the logic "0" data bit value is latched by the latch portion 275.

When a pulse signal RESET having a first program time T1 is input to a gate of a transistor 293, the transistor 293 transmits the second signal, for example, a ground voltage Vss signal, or the logic "0" data bit value to the resistive memory cell 50' via the bit line BL1 during the first program time T1.

During the verify write operation, the precharge circuit 261 and the discharge circuit 263 are disabled and the read enable signal REN is activated to a high level. Thus, the switching circuit 265 is turned on.

When the resistance value of the resistive memory cell 50' is changed from a high resistance value to a low resistance value, since a high pass-through current flows in the resistive memory cell 50', the voltage of the bit line BL1 becomes higher than the reference voltage Vref. Thus, the voltage comparator 269 generates the detection voltage DET having a high level.

Since a transistor 273 is turned on in response to a control signal VFY that is activated to a high level during the verify read operation, and the transistor 271 is turned on in response to the detection voltage DET having a high level, the voltage of a gate of the transistor 291 becomes a low level. Thus, the driver 290 is disabled. The output terminal of the inverter 297 becomes a low level.

However, when the resistance value of the resistive memory cell 50' is not changed appropriately from a high resistance value to a low resistance value, since a low pass-through current flows in the resistive memory cell 50' during the verify read operation, the voltage of the bit line BL1 becomes lower than the reference voltage Vref. Accordingly, the voltage comparator 269 generates the detection voltage DET having a low level. Thus, even when the transistor 273 is turned on in response to the control signal VFY, the transistor 271 maintains an off state in response to the detection voltage DET having a low level. The detection voltage DET having a low level does not affect the operation of the latch portion 275. Thus, the latch portion 275 maintains the logic "0" data bit value.

When the pulse signal RESET having a second program time T2 is input to the gate of the transistor 293 for the next program loop, the transistor 293 transmits the second signal, for example, the ground voltage Vss signal, to the resistive memory cell 50' via the bit line BL1 only during the second program time T2.

The write circuit 270 repeatedly performs the program operation and the verify read operation while increasing the program time until the resistance value of the resistive memory cell 50' is changed from a high resistance value to a low resistance value, an amorphous state is changed to a crystal state, or the logic "1" data bit value is changed to the logic "0" data bit value.

Thus, the pulse generator 252 performs a program operation while sequentially supplying the pulse signal RESET having a third program time T3, the pulse signal RESET having a fourth program time T4, and the pulse signal RESET having a fifth program time T5, as the number of the program operation, for example, a result operation, or the program loop increases.

At the fifth program loop (or number), when the resistance value of the resistive memory cell 50' is changed from a high resistance value to a low resistance value, the threshold voltage distribution or the resistance distribution is in a desired state, an amorphous state is changed to a crystal state, or the logic "1" data bit value is changed to the logic "0" data bit value, the voltage comparator 269 outputs the detection voltage DET having a high level. Thus, the driver 290 is disabled in response to the detection voltage DET having a high level.

That is, when the state of the resistive memory cell 50' does not reach a desired state, the control block 250 repeatedly performs the write operation and the verify read operation while increasing the program time.

In the present embodiment, the program time increases according to the program number. However, the present inventive concept is not limited thereto, and thus, the program time may decrease according to the program number, or may have a predetermined pattern (for example, a pattern which increases and then decreases the program time) according to the program number.

Also, the control block 250 performs the program operation and the verify read operation while increasing the program voltage and the program time together as illustrated in FIG. 19. For example, during the first program operation, for example, the reset operation, the control block 250 provides write data, for example, the logic "0" data bit value, to the resistive memory cell 50', in response to a pulse signal having a voltage of a first level V1 and a first program time T11. As a result of the verify read operation, the control block 250 provides write data to the resistive memory cell 50', in response to a pulse signal having a voltage of a second level V2 and a second program time T12. The control block 250 provides write data to the resistive memory cell 50', in response to a pulse signal having a voltage of a third level V3 and a third program time T13.

In the present embodiment, the program time and the program voltage increase together according to the program number. However, the present inventive concept is not limited thereto, and thus, the program time and the program voltage may decrease together according to the program number, or may have a predetermined pattern (for example, a pattern which increases and then decreases the program time and magnitude or pattern which increases one of the program time and magnitude while decreasing the other) according to the program number.

Figure 20:
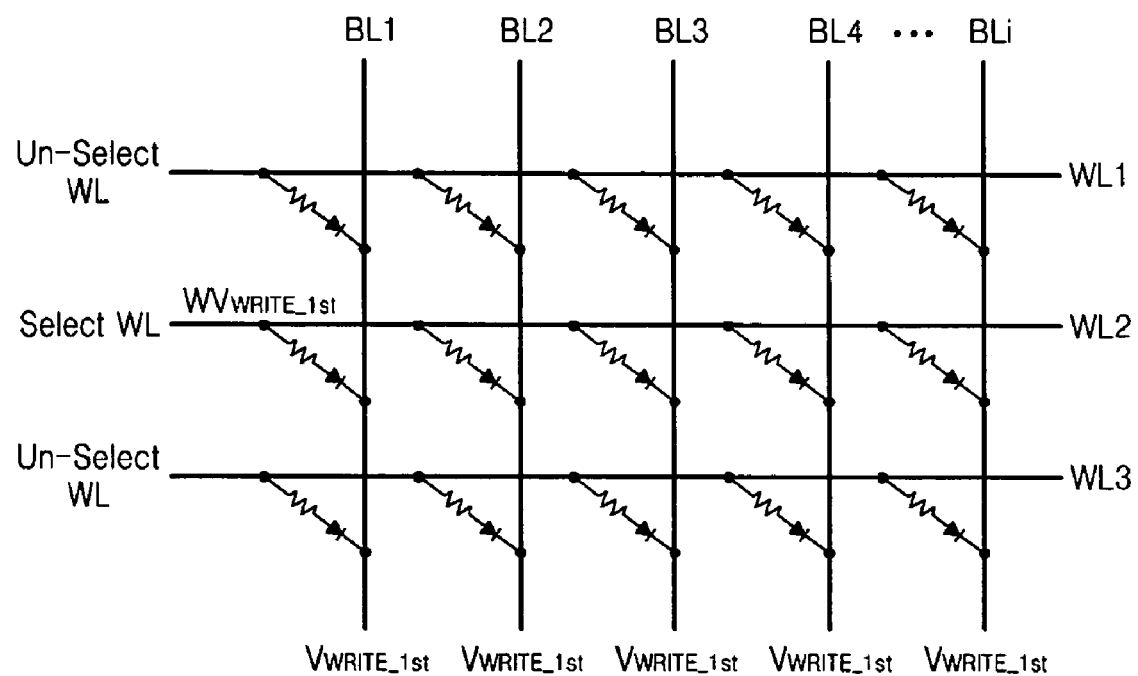
FIGS. 20 and 21 illustrate diagrams for explaining the program operation and the structure of a memory cell array of FIG. 16.
Figure 21:
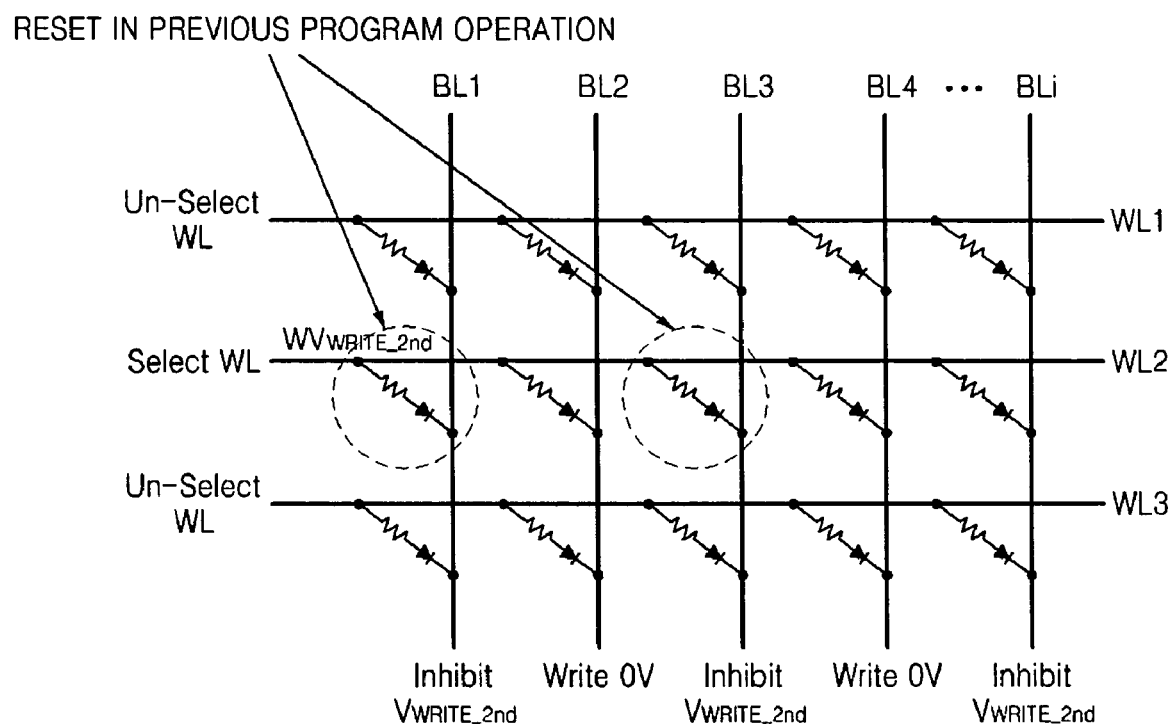

Also, in the present embodiment, the program pulse is a program voltage pulse. However, the present inventive concept is not limited thereto, and thus, the program pulse may be a program current pulse. FIGS. 20 and 21 are diagrams for explaining the program operation and the structure of a memory cell array of FIG. 16.

Referring to FIGS. 16, 17, 20, and 21, during the set operation, a word line voltage WVWRITE_1ST is provided to the second word line WL2 selected by the row address X-ADD. When a plurality of bit lines BL1, BL2, BL3, BL4, and BLi are selected by the column address Y-ADD, the control block 250 provides a first signal VWRITE_1ST to the bit lines BL1, BL2, BL3, BL4, and BLi. The first signal VWRITE_1 ST may be the first voltage Vdd. Thus, the resistive memory cell 50' connected to each of the bit lines BL1, BL2, BL3, BL4, and BLi is programmed to have a high resistance value, that is, the logic "1" data bit value.

When the resistive memory cell 50' connected to each of the first bit line BL1, the third bit line BL3, and the i-th bit line BLi is to be reset, for example, the logic "0" data bit value is to be programmed, the second signal, that is, the signal corresponding to the logic "0" data bit value, is provided to the first bit line BL1, the third bit line BL3, and the i-th bit line BLi while increasing the program time according to the program loop.

When the resistive memory cell 50' connected to each of the bit lines BL1, BL2, BL3, BL4, and BLi is programmed to have a low resistance value, that is, the logic "0" data bit value as a result of the program operation and the verify read operation, while increasing the program time for each program loop, the voltage comparator 269 connected to each of the bit lines BL1, BL2, BL3, BL4, and BLi outputs the detection voltage DET having a high level. Accordingly, the driver 290 of the write circuit 270 connected to each of the bit lines BL1, BL2, BL3, BL4, and BLi is disabled in response to the detection voltage DET. Thus, the drive 290 of the write circuit 270 connected to each of the bit lines BL1, BL2, BL3, BL4, and BLi does not provide the second signal to the resistive memory cell 50' connected to each of the bit lines BL1, BL2, BL3, BL4, and BLi.

When the resistive memory cell 50' connected to each of the second bit line BL2 and the fourth bit line BL4 is to be reset, for example, to be programmed to have the logic "0" data bit value, the driver 290 of the write circuit 270 connected to each of the second bit line BL2 and the fourth bit line BL4 supplies the second signal to each of the second bit line BL2 and the fourth bit line BL4 while increasing the program time for each program loop until the resistive memory cell 50' connected to each of the second bit line BL2 and the fourth bit line BL4 is reset.

Figure 22:
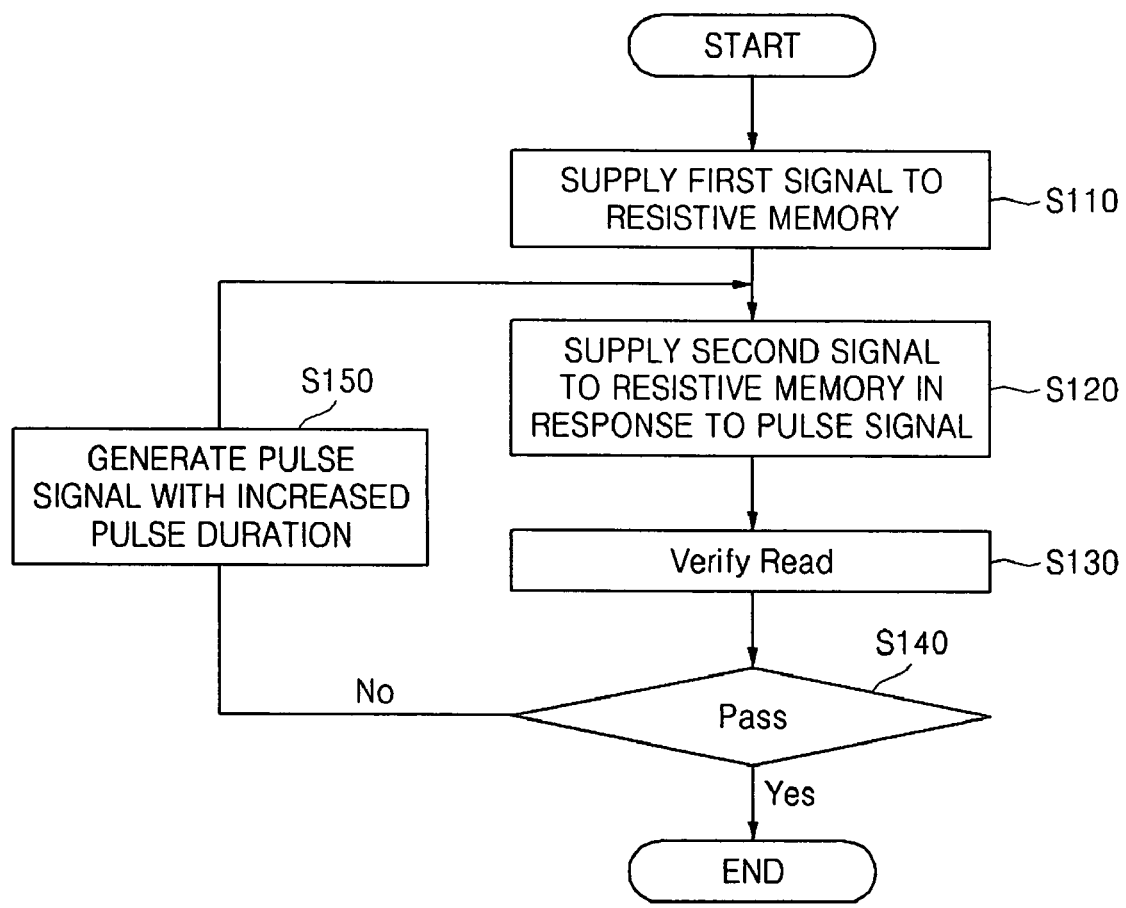
FIG. 22 illustrates a flowchart for explaining a method of programming a semiconductor device according to an exemplary embodiment of the present inventive concept.

FIG. 22 illustrates a flowchart for explaining a method of programming a semiconductor device according to an exemplary embodiment of the present inventive concept. Referring to FIGS. 16-22, during the set operation, the control block 250 supplies the first signal to the resistive memory cell 50' embodied in the memory cell array 220 via the bit line, so that the resistive memory cell 50' may indicate the logic "1" data bit value (S110).

During the first reset operation, or in the first program loop, in response to the write data, for example, the pulse signal RESET having the logic "0' data bit value and the first program time T1, the control block 250 supplies the second signal to the resistive memory cell 50' so that the resistive memory cell 50' may indicate the logic "0" data bit value (S120). During the first verify read operation, the control block 250 compares the reference voltage Vref and the voltage corresponding to the pass-through current of the resistive memory cell 50', and outputs the detection voltage DET according to a result of the comparison.

When the detection voltage DET has a high level, that is, the verify read operation is passed (S140), the control block 250 disables the driver 290 in order to supply the second signal to the resistive memory cell 50'. Thus, the first reset operation is completed. However, when the detection voltage DET has a low level, that is, the verify read operation fails (S140), the pulse generator 252 of the control block 250 generates the pulse signal RESET having the second program time T2 (S150). Thus, in response to the pulse signal RESET having the second program time T2, the control block 250 supplies the second signal to the resistive memory cell 50' so that the resistive memory cell 50' may indicate the logic "0" data bit value. That is, the control block 250 performs the second reset operation or the second program loop.

During the second verify read operation, the control block 250 compares the reference voltage Vref and the voltage corresponding to the pass-through current of the resistive memory cell 50', and outputs the detection voltage DET according to a result of the comparison.

When the detection voltage DET has a high level, that is, the verify read operation is passed (S140), the control block 250 disables the driver 290 in order to supply the second signal to the resistive memory cell 50'. Thus, the second reset operation is completed. However, when the detection voltage DET has a low level, that is, the verify read operation fails (S140), the pulse generator 252 of the control block 250 generates the pulse signal RESET having the third program time T3 (S150). Thus, in response to the pulse signal RESET having the third program time T3, the control block 250 supplies the second signal to the resistive memory cell 50' so that the resistive memory cell 50' may indicate the logic "0" data bit value. That is, the control block 250 performs the third reset operation or the third program loop.

The control block 250 detects the voltage corresponding to the resistance value of the resistive memory cell 50' for each program loop, and performs the program operation and the verify read operation while increasing the program time or the pulse duration according to the detected voltage. Also, the control block 250 detects the voltage corresponding to the resistance value of the resistive memory cell 50' for each program loop, and performs the program operation and the verify read operation until the verify read operation is completed, that is, the threshold voltage distribution or the resistance distribution becomes a desired state, while increasing the program time or the pulse duration according to the detected voltage.

The above-described embodiments of FIGS. 16-22 may be applied to the programming of a memory cell based on the resistance dispersions of FIGS. 4A-15. For example, according to the resistance value of the resistive memory cell 50', the first bit or the second bit may be written or programmed by repeatedly performing the program operation and the verify read operation while changing, for example, increasing, decreasing, or by a combination of increasing and decreasing, the program time for writing the first bit, for example, the LSB, or the second bit, for example, the MSB, to the resistive memory cell 50' according to the program number.

Also, according to the resistance value of the resistive memory cell 50', the first bit or the second bit may be written or programmed by repeatedly performing the program operation and the verify read operation while changing the program time and the program voltage or current for writing the first bit, for example, the LSB, or the second bit, for example, the MSB, to the resistive memory cell 50' according to the program number.

Figure 23:
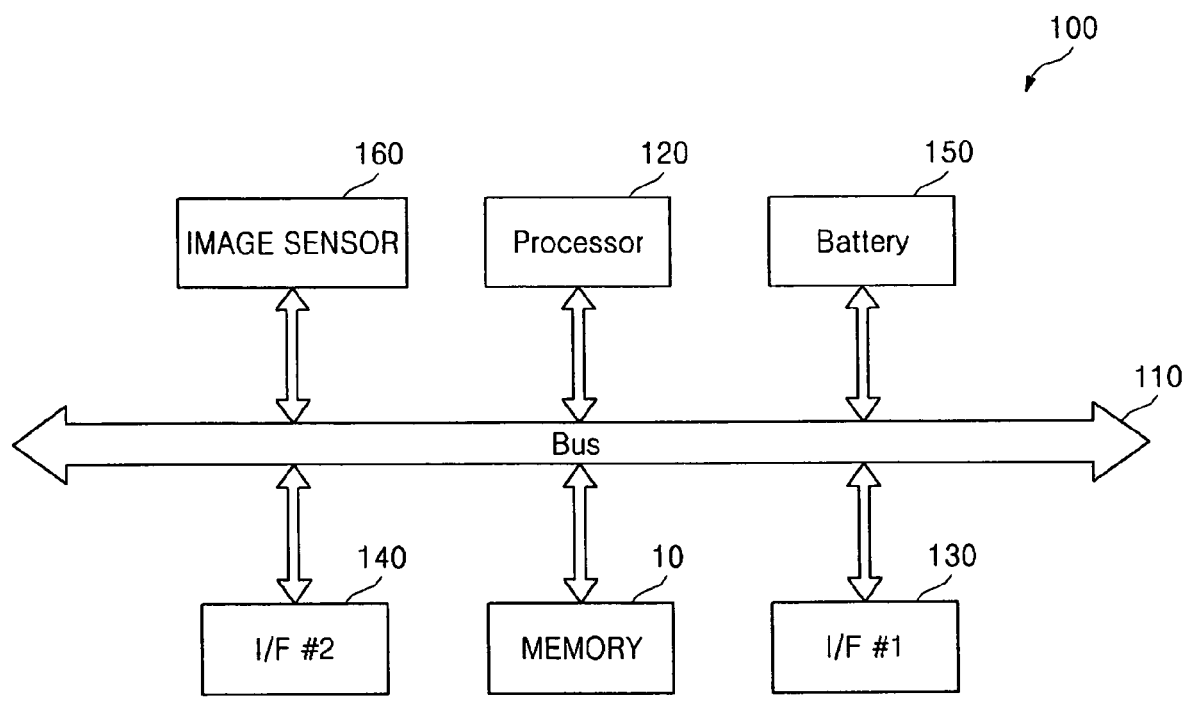
FIG. 23 illustrates a block diagram of a semiconductor system including a semiconductor device according to an exemplary embodiment of the present inventive concept.

FIG. 23 illustrates a block diagram of a semiconductor system 100 including a semiconductor device according to an exemplary embodiment of the present inventive concept. Referring to FIGS. 1 and 23, the semiconductor system 100, e.g., a computer, may include the semiconductor device 10 and a processor 120 connected to a system bus 110.

The processor 120 may generally control the write operation, the read operation, or the verify read operation of the semiconductor device 10. For example, the processor 120 outputs write data and a command to control the write operation of the semiconductor device 10. Also, the processor 120 may generate a command to control the read operation or the verify read operation of the semiconductor device 10. Thus, the control block (20 in FIG. 1 or 250 in FIG. 16) of the semiconductor device 10 may perform the verify read operation, the program operation, or the write operation in response to the control signal output from the processor 120.

When the semiconductor system 100 is implemented as a portable application, the semiconductor system 100 may further include a battery 150 for supplying operation power to the semiconductor device 10 and the processor 120. The portable application includes portable computers, digital cameras, personal digital assistants (PDAs), cellular telephones, MP3 players, portable multimedia players, automotive navigation systems, memory cards, smart cards, game consoles, electronic dictionaries, or solid state discs.

The semiconductor system 100 may further include an interface, for example, an I/O device 130, for exchange data with an external data processing device. When the semiconductor system 100 is a wireless system, the semiconductor system 100 may further include a wireless interface 140. In this case, the wireless interface 140 may be connected to the processor 120 to wirelessly exchange data with an external wireless device (not shown) via the system bus 110. For example, the processor 120 may process the data input through the wireless interface 140 and store the processed data in the memory device 10, or read out the data from the memory device 10 and transmit the read data to the wireless interface 140.

The wireless system may be a wireless device such as PDAs, portable computers, wireless telephones, pagers, or digital cameras, radio-frequency identification (RFID) readers, or RFID systems. Also, the wireless system may be wireless local area network (WLAN) systems or wireless personal area network (WPAN) systems. Also, the wireless system may be a cellular network.

When the semiconductor system 100 is an image pick-up device, the semiconductor system 100 may further include an image sensor 160 for converting an optical signal to an electric signal. The image sensor 160 may be an image sensor using a charge coupled device (CCD) or a complementary metal-oxide semiconductor (CMOS) image sensor manufactured using a CMOS process. In this case, the semiconductor system 100 may be a digital camera or a cellular telephone having a digital camera function. Also, the semiconductor system 100 may be an artificial satellite system to which a camera is attached.

Figure 24:
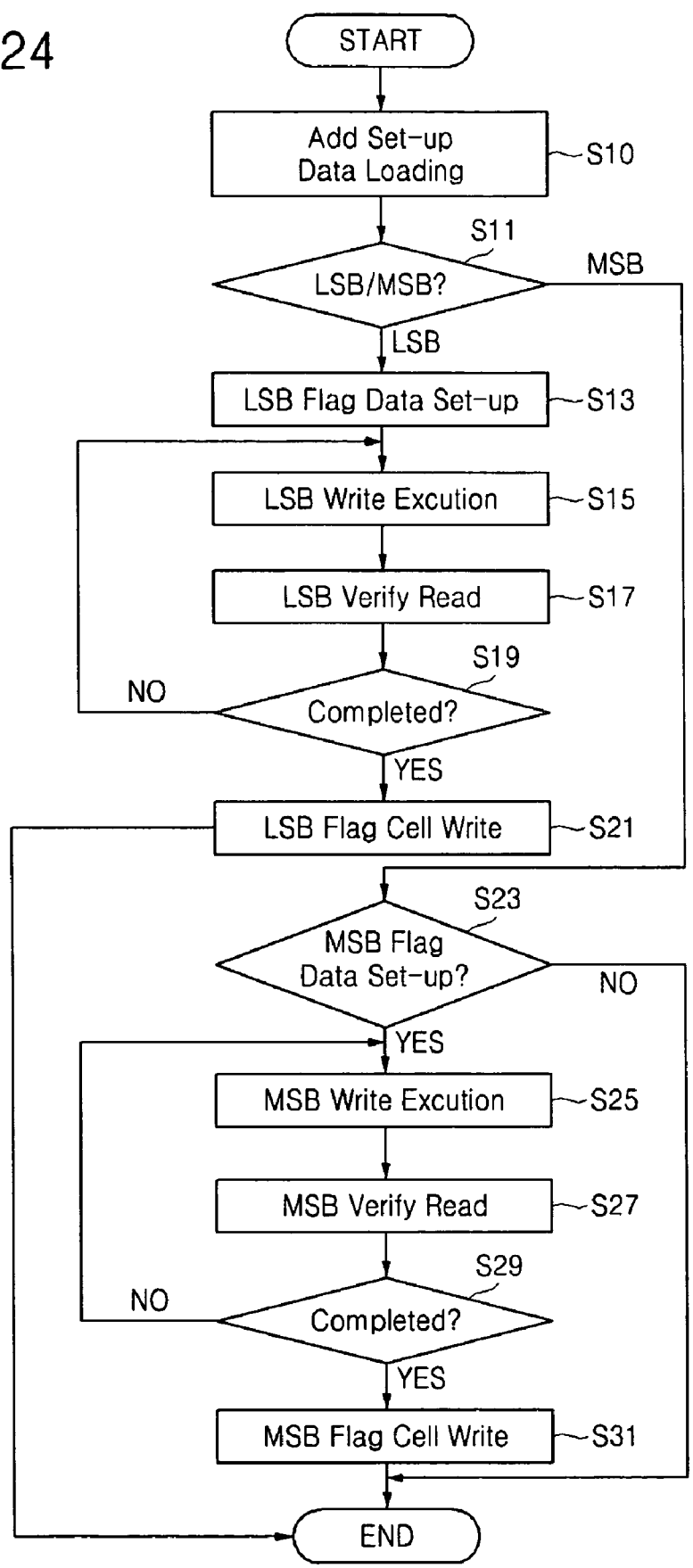
FIG. 24 illustrates a flowchart for explaining a method of programming a semiconductor device according to an exemplary embodiment of the present inventive concept.

FIG. 24 illustrates a flowchart for explaining a method of programming a semiconductor device according to an exemplary embodiment of the present inventive concept. Referring to FIGS. 1-3 and 24, when data is written or programmed to the resistive memory cell 50, the I/O buffer 22 loads address and data generated from the external controller 32 (S10). The internal control circuit 20 determines whether the write operation to the first bit is performed or the write operation to the second bit is performed (S11). As a result of the operation S11, if the internal control circuit 20 determines that the write operation to the first bit is performed, the internal control circuit 20 sets up flag data stored in a first flag data storage cell (not shown) for storing flag data to the first bit, for example, the LSB, of the resistive memory cells forming the memory cell array 40 (S13).

The flag data to the first bit, for example, the LSB, is data indicating whether the write operation to the first bit is already completed. For example, the flag data to the first bit may include information about whether the write operation to the first bit of the resistive memory cell 50 is already completed or the semiconductor device 10 is abnormally off so that the write operation may not be completed.

The internal control circuit 20 may analyze the flag data (S13). When the write to the first bit, for example, the LSB, is already completed as a result of analysis in the operation S23, the write circuit 57 may complete the program operation.

Otherwise, the write circuit 57 may perform the program operation for the first bit to the resistive memory cell 50 (S15). Also, the read circuit 60 may perform the verify write to the data stored in the first bit (S17).

The write circuit 57 determines whether write is completed as a result of the verify write in the operation S17 (S19). For example, when the write is not completed as a result of the verify write in the operation S17, the write circuit 57 may perform the operation S15 again. Otherwise, the write circuit 57 may write flag data indicating that the write operation to the first bit is completed, to a first flag data storage cell (not shown) (S21).

As a result of the operation S11, if the internal control circuit 20 determines that the write operation to the second bit is performed, the internal control circuit 20 sets up the flag data stored in a second flag data storage cell (not shown) for storing flag data to the second bit, for example, the MSB, of the resistive memory cells 50 forming the memory cell array 40, and analyzes the flag data (S23).

When the write to the second bit, for example, the MSB, is already completed as a result of analysis in the operation S23, the write circuit 57 completes the program operation. Otherwise, the write circuit 57 may perform the program operation for the second bit to the resistive memory cell 50 (S25). The read circuit 60 may perform the verify write to the data stored in the second bit (S27).

The write circuit 57 determines whether the write is completed as a result of the verify write in the operation S27 (S29). For example, when the write is not completed as a result of the verify write in the operation S27, the write circuit 57 may perform the operation S25 again. Otherwise, the write circuit 57 may complete the program operation. Also, when the write is completed as a result of the verify write in the operation S27, the write circuit 57 may write flag data indicating that the write operation to the second bit is completed, to the second flag data storage cell (S31).

As described above, according to the present inventive concept, the semiconductor device, the semiconductor system having the same, and the method of programming a resistive memory cell enable fast execution of a program.

While the inventive concept has been particularly shown and described with reference to exemplary embodiments thereof, it will be understood that various changes in form and details may be made therein without departing from the spirit and scope of the following claims.

What is claimed is:

1. A method of writing multi-bit data to a semiconductor memory device with memory cells storing data defined by a threshold value, the method comprising, for each memory cell:
   writing a least significant bit;
   verifying completion of writing the least significant bit, verifying including comparing a written value to one of a low least significant bit verification value and a high least significant bit verification value; and
   writing a next significant bit upon completion of writing the least significant bit.

2. The method as claimed in claim 1, wherein writing the least significant bit includes applying a write signal having a value higher than the threshold value.

3. The method as claimed in claim 1, wherein writing the least significant bit and the next significant bit for a current memory cell is completed before writing to a next memory cell.

4. The method as claimed in claim 1, wherein a value dispersion of a next significant bit having a first logic level and a value dispersion of a next significant bit having a second logic level each partially overlap a value dispersion of the least significant bit on opposite sides of the value dispersion of the least significant bit.

5. The method as claimed in claim 1, wherein a value dispersion of a next significant bit having a first logic level completely overlaps a value dispersion of the least significant bit.

6. The method as claimed in claim 1, wherein:
   writing the least significant bit includes writing a first value less than a reference value when the least significant bit has a first logic level and writing a second value greater than the reference value when the least significant bit has a second logic level;
   when the least significant bit has the first logic level, writing the next significant bit includes writing a third value less than the reference value; and
   when the least significant bit has the second logic level, writing the next significant bit includes writing a fourth value greater than the reference value.

7. The method as claimed in claim 6, wherein the first value and the second value are spaced symmetrically with respect to the reference value.

8. The method as claimed in claim 6, wherein the first value is closer to the reference value than the second value.

9. The method as claimed in claim 6, wherein the third value is greater than or equal to the first value and the fourth value is less than or equal to the second value.

10. The method as claimed in claim 6, wherein the third value is less than or equal to the first value and the fourth value is greater than or equal to the second value.

11. The method as claimed in claim 6, wherein the third value is less than or equal to the first value and the fourth value is less than or equal to the second value.

12. The method as claimed in claim 6, wherein the third value is greater than or equal to the first value and the fourth value is greater than or equal to the second value.

13. The method as claimed in claim 1, wherein:
   writing the least significant bit includes writing a first value less than a reference value when the least significant bit has a first logic level and writing a second value greater than the reference value when the least significant bit has a second logic level;
   when the least significant bit has the first logic level, writing a most significant bit includes writing a third value less than the reference value; and
   when the least significant bit has the second logic level, writing the most significant bit includes writing a fourth value greater than the reference value.

14. The method as claimed in claim 1, wherein each memory cell is a variable resistive memory cell.

15. The method as claimed in claim 14, wherein the variable resistive memory cell is a phase change memory cell.

16. The method as claimed in claim 1, wherein, when verifying indicates writing is not complete, altering a current write signal used in writing to generate an altered write signal different from the current write signal and writing the least significant bit using the altered write signal.

17. The method as claimed in claim 16, wherein altering the current write signal includes varying at least one of a pulse width and a pulse height of the current write signal.

18. The method as claimed in claim 17, wherein varying includes increasing at least one of a pulse width and a pulse height of the current write signal.

19. The method as claimed in claim 16, further comprising verifying completion of writing the next significant bit, and, when verifying indicates writing of the next significant bit is not complete, altering a current write signal used in writing the next significant bit to generate an altered write signal different from the current write signal and writing the next significant bit using the altered write signal.

20. The method as claimed in claim 1, wherein the next significant bit is written to a cell that is not adjacent to a cell in which the least significant bit is written.

21. A method of writing multi-bit data to a variable resistive memory device, the method comprising:
   writing a least significant bit including applying a write signal to a variable resistive memory cell to alter a resistance of the variable resistive memory cell; and
   writing a next significant bit upon completion of writing the least significant bit.

22. The method as recited in claim 21, further comprising, before writing the next significant bit, verifying completion of writing the least significant bit.

23. The method as recited in claim 22, wherein verifying includes comparing a written resistance value to one of a low least significant bit verification value and a high least significant bit verification value.

24. The method as recited in claim 21, further comprising verifying completion of writing the next significant bit including comparing a written resistance value to a single next significant bit verification value.

25. The method as claimed in claim 21, wherein the variable resistive memory cell is a phase change memory cell.

* * * * *